US010769346B1

(12) United States Patent
Yu et al.

(10) Patent No.: US 10,769,346 B1
(45) Date of Patent: Sep. 8, 2020

(54) METHOD, SYSTEM, AND COMPUTER PROGRAM PRODUCT FOR REARRANGEMENT OF OBJECTS WITHIN AN ELECTRONIC DESIGN

(71) Applicant: Cadence Design Systems, Inc., San Jose, CA (US)

(72) Inventors: Henry Yu, Palo Alto, CA (US); Hui Xu, Wexford, PA (US); Karun Sharma, Fremont, CA (US); Sandipan Ghosh, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 165 days.

(21) Appl. No.: 15/857,561

(22) Filed: Dec. 28, 2017

(51) Int. Cl.
*G06F 30/398* (2020.01)
*G06F 3/0486* (2013.01)
*G06F 30/392* (2020.01)

(52) U.S. Cl.
CPC .......... *G06F 30/398* (2020.01); *G06F 3/0486* (2013.01); *G06F 30/392* (2020.01)

(58) Field of Classification Search
USPC ........................................................ 716/119
See application file for complete search history.

(56) References Cited

U.S. PATENT DOCUMENTS

| 7,770,145 B2* | 8/2010 | Nakano | G06F 17/5068 716/53 |
| 2002/0108096 A1* | 8/2002 | Lee | B01F 15/00935 716/30 |
| 2009/0271752 A1* | 10/2009 | Alpert | G06F 17/5072 716/119 |
| 2011/0145775 A1* | 6/2011 | Sano | G06F 17/5068 716/122 |

OTHER PUBLICATIONS

Username:Jimbo, "Using EAGLE: Board Layout", URL:https://learn.sparkfun.com/tutorials/using-eagle-board-layout/all, Jun. 2016.
Matthias Kofferlein, "High Performance Layout Viewer and Editor, Version 0.21.16", Mar. 26, 2012.
"Advanced Design System 2009 Documentation: Setting Layout Options" URL:https://edadocs.software.keysight.com/display/ads2009/Setting+Layout+Options 2009.
"EE559 Lab Tutorial 3: Virtuoso Layout Editing Introduction", URL:https://engineering.purdue.edu/~vlsi/ECE559_Fall09/Lab/559TUT_3_ver7_fall09.pdf, 2009.
Keefe Bohannan, "ADS Momentum: A Half-Day Seminar", Agilent Technologies, URL:http://www.eas.uccs.edu/~mwickert/ece5250/notes/Slides_for_Half_day_Momentum.pdf, Apr. 2003.

(Continued)

*Primary Examiner* — Mohammed Alam
(74) *Attorney, Agent, or Firm* — Vista IP Law Group, LLP

(57) ABSTRACT

Disclosed is an approach for implementing placement for an electronic design, where when a dragged object is moved into a desired area, existing objects in that location are automatically moved as necessary in correspondence to the movement of the dragged object. Existing objects are only moved if they are causing a spacing violation or overlap with the dragged object being moved, either directly or indirectly.

20 Claims, 26 Drawing Sheets

(56) References Cited

OTHER PUBLICATIONS

"Virtuoso Layout Design", TUDelft, URL:http://cas.et.tudelft.nl/~nick/courses/digic-0809/files/layout-exercise.pdf, Jun. 2009.
"Adobe InDesign User Guide: About anchored objects", URL:https://helpx.adobe.com/indesign/using/anchored-objects.html, Mar. 16, 2017.
"Working with images in Word 2013", The University of Edinburgh,URL:http://www.docs.is.ed.ac.uk/skills/documents/3818/3818.pdf, Feb. 2016.
"InDesign: how to get anchored objects to flow within the text boxes", Stackxchange.com, URL:https://graphicdesign.stackexchange.com/questions/67194/indesign-how-to-get-anchored-objects-to-flow-within-text-boxes, Feb. 2016.
"KLayout Documentation (Qt 4): DRC Reference: Layer Object", klayout.de, URL:https://www.klayout.de/doc-qt4/about/drc_ref_layer.html, Jan. 2018.
Belzunce et al., "LibreOffice the Document Foundation, Writer Guide, Chapter 8, Working with Images", URL:https://documentation.libreoffice.org/assets/Uploads/Documentation/en/WG4.2/PDF/WG4208-WorkingWithImages.pdf, Jun. 2014.

\* cited by examiner

METHOD, SYSTEM, AND COMPUTER PROGRAM PRODUCT FOR REARRANGEMENT OF OBJECTS WITHIN AN ELECTRONIC DESIGN

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

Chip designers often use electronic design automation (EDA) software tools to assist in the design process. Chip design using EDA software tools generally involves an iterative process whereby the chip design is gradually perfected. A top-down design methodology is commonly employed using hardware description languages (HDLs), such as Verilog or VHDL for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (e.g., given specific coordinate locations in the circuit layout) and "routed" (e.g., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity.

In the area of custom designs, the user can directly and interactively conduct placement and routing in a manual approach, e.g., by manually manipulating the location of objects. In addition, after an initial placement/routing process that may have undergone either auto-placement or interactive placement, the layout may still undergo additional interactive changes to the existing placement of objects, by potentially inserting or moving objects in areas of the design where other objects have already been placed.

When an object is moved into an area of the design that is already populated with other objects, the other objects already in that area may need to be displaced to make room for the new object. The conventional approach to address this issue is a sequence of manual steps, where the user selects objects that have already been placed into the target location, and moves them to create space for the objects being moved. This may include the manual action to move the object(s) to the target location. In particular, the sequence of steps includes manual actions to interactively re-place the moved objects. However, this conventional approach is subject to numerous problems. First, this approach requires numerous manual steps to be performed by the user for each object. In modern electronic designs that include large numbers of components placed onto a layout, this may require a significant amount of manual steps for a large number of objects that potentially need to be moved.

In addition, there are challenges to being able to identify DRC (design rule checking) correct locations for the moved objects. The above difficulties are further magnified when it is considered that modern designs with advanced nodes includes very high density instances, as well as having very complex spacing and object snapping rules.

Therefore, there is a need for an improved approach to implement placement to address at least the aforementioned shortfalls of conventional approaches.

SUMMARY

Disclosed are method(s), system(s), and article(s) of manufacture for implementing placement for an electronic design, where when a dragged object is moved into a desired area, existing objects in that location are automatically moved as necessary in correspondence to the movement of the dragged object. In some embodiments, existing objects are only moved if they are causing a spacing violation or overlap with the dragged object being moved, either directly or indirectly.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

As previously discussed, when an object is moved into an area of the design that is already populated with other objects, other objects already in that area may need to be displaced to make room for the new object. The conventional approach to address this issue is highly problematic, since conventional EDA tools require an extensive sequence of manual actions to be taken by a user to resolve the problem.

The present disclosure provides improved method(s), system(s), and article(s) of manufacture for implementing placement for an electronic design, where when dragging an object to a desired area, existing objects in that location are automatically moved as necessary in correspondence to the movement of the dragged object.

This is a significant improvement over conventional placement technologies, since the inventive approach provides the ability to create and edit sequences of objects freely and in a predictable manner, while maintaining an overlap-free state. In addition, the inventive approach avoids the need to require multiple steps to be performed by the user for each object to be moved or inserted, which is particularly advantageous in very dense areas of the electronic design. Moreover, this approach automatically addresses the need to identify DRC-correct locations for moved objects.

Figure 1:
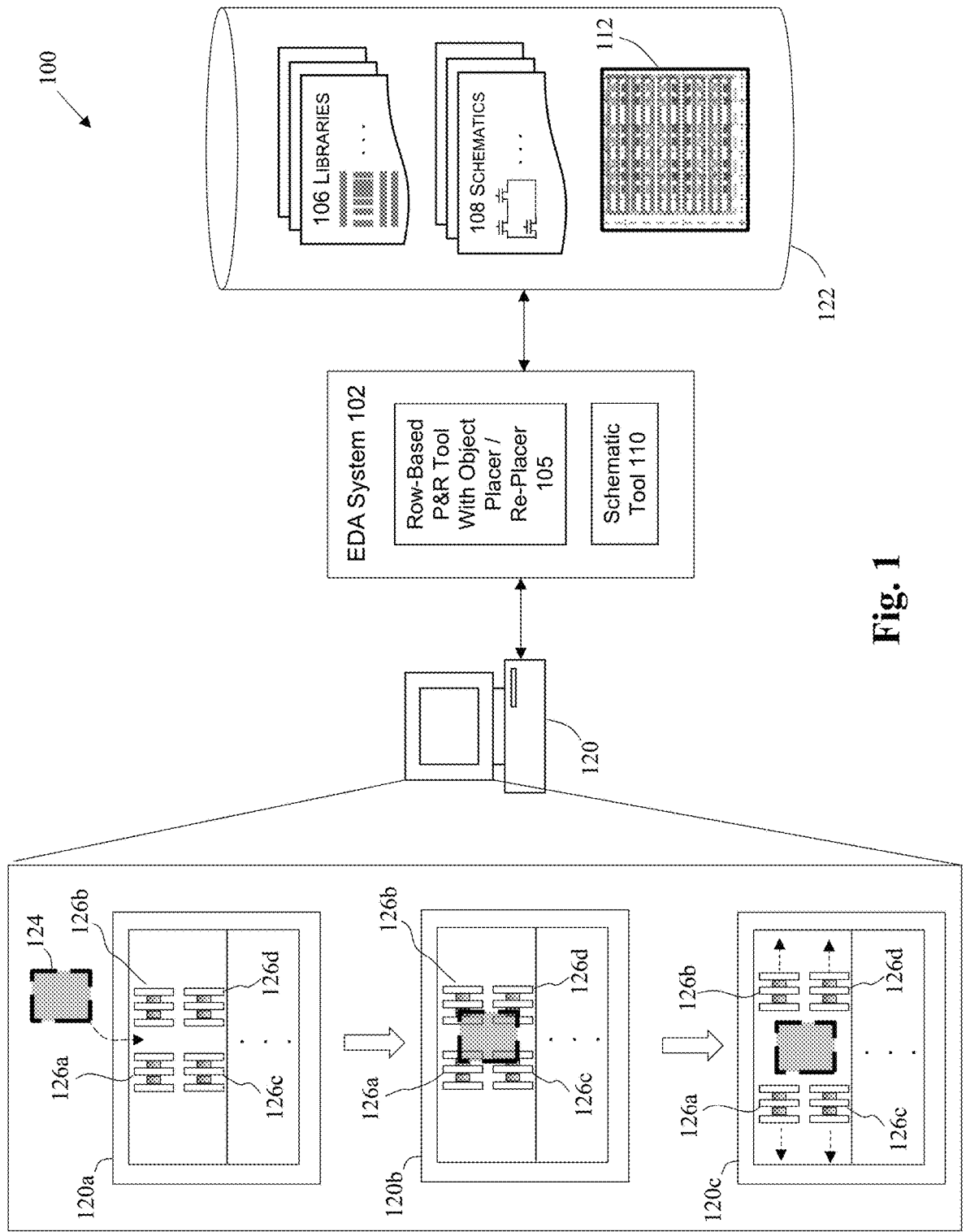
FIG. 1 illustrates an example system which may be employed in some embodiments of the invention.

FIG. 1 illustrates an example system 100 which may be employed in some embodiments of the invention. System 100 may include one or more users that interface with and operate a computing system to control and/or interact with system 100 using a computing station 120. Such users include, for example, electronic designers and engineers. The computing system comprises any type of computing station 120 that may be used to operate, interface with, or implement one or more EDA systems/applications 102. Examples of such computing systems include for example, servers, workstations, personal computers, or remote computing terminals connected to a networked or cloud-based computing platform. The computing system may comprise one or more input devices for the user to provide operational control over the activities of the system 100, such as a mouse or keyboard to manipulate a pointing object.

Layout scenario 120a corresponds to a first version of a design layout having a set 126a, 126b, 126c, and 126d of existing objects and/or instances of design components, which are herein referred to interchangeably as either "objects" or "instances". Examples of such objects/instances include, for example, individual devices, device chains, multi-row groups of devices (e.g., a FigGroup/Modgen), custom cells, I/O pins, filler cells, and/or standard cells. A FigGroup is a grouping of circuit components used within certain applications, such as the Open Access database. A Modgen is an approach to group together block(s) of circuit components. The creation of certain groups forms a corresponding physical hierarchy in the layout, whereas other types of groups may create a logical hierarchy which may be further solidified into a physical hierarchy if the grouping is what a designer desires. It shall be noted that the terms "blocks," "cells," "groups," "FigGroups," "fig_groups", and "Modegen" may in certain circumstances be used interchangeably throughout this disclosure, unless otherwise specifically recited or distinguished. As discussed in more detail below, in some embodiments the design layout 120a may be implemented in a row-based approach, where the objects are placed within row-based constructs/templates.

In operation, a user may seek to manually edit the electronic design. For example, the user may seek to interactively insert and/or move object 124 into the layout 120a into the location shown in the figure. The object 124 may be manipulated in any interactive manner useable within an EDA tool. For example, a mouse or other manipulation device may be employed to select the object 124 for movement, where object 124 is then "dragged" and "dropped" to a desired location on the layout.

The problem is, as shown in layout scenario 120b, that the dragged location for object 124 may cause this object to overlap with existing objects 126a, 126b, 126c, and 126d in the layout. Failing to address this problem will, of course, create numerous problems with the functioning of the eventual electronic product that will include this electronic design.

As previously noted, unlike the current invention, this problem is addressed by conventional EDA tools by requiring the user to manually shift the existing objects 126a, 126b, 126c, and 126d to avoid the overlap while still maintaining DRC-correct locations for all of the moved objects. However, when these objects 126a, 126b, 126c, and 126d are moved to different locations, this movement may cause other objects that already exist in those locations to also need to be manually moved as well, which may cause yet even more objects to be manually moved. This ripple effect may stretch across a wide swath of the design, creating an extremely complicated situation for a user to be required to navigate and handle, which may be an intractable problem if it needs to be manually resolved given the fact that modern designs are very often dense having large amounts of objects packed into small regions where each and every one of the moved objects should be moved to a non-overlap location that complies with applicable design rules.

In the current embodiment, a placer/re-placer component 105 within the EDA system 102 automatically re-places the existing objects 126a, 126b, 126c, and 126d to resolve any overlaps with the dragged object 124. The placer/re-placer component 105 will also handle any additional objects that need to be re-placed as a result of the user interaction with respect to object 124. As shown in layout scenario 120c, this means that the existing objects 126a, 126b, 126c, and 126d are moved to new locations that will no longer overlap with the dragged object 124.

As discussed in more detail below, the placer/re-placer component 105 takes a greedy, cost-based approach to shift the location of objects within the layout. Existing instances are only moved if they are causing a spacing violation or overlap with the instance being moved, either directly or indirectly. When the user moves the object 124 to be placed in the desired area and the existing instances are re-placed, the following objectives in mind are considered: (a) minimum perturbation; (b) wire length improvement; (c) design rule correctness; (d) placement constraints; and/or (e) respecting device and metal grids.

It is noted that the EDA system 102 may include a plurality of EDA modules to perform the above-described inventive actions. For example, as discussed above, the placer/re-placer component 105 is provided to move the locations of objects within the layout. In addition, one or more schematic tools 110 (e.g., a schematic editor) may be used to manipulate corresponding schematics 108. While not shown in this figure, additional modules may also be employed in conjunction with the EDA system 102. For example, a UI (user interface) module can be employed to generate a user interface to display and interactively manipulate the electronic design. e.g., a row-based electronic design 112. The EDA system 102 further includes a DRC checking tool to check for any rules violations that may exist for any of the configurations placement tool. Design rules are a series of parameters provided by semiconductor manufacturers, specifying geometric and connectivity restrictions to ensure sufficient margins to account for variability in semiconductor manufacturing processes. The DRC checking tool is applied to verify the correctness of any designs, and to identify possible issues that may affect overall yield or reliability for the design. The plurality of EDA modules may access the libraries 106 of various cells, block, etc. to identify the cells, blocks, etc. and instantiate instances according to the corresponding schematics 108.

The data accessed or generated by EDA system 102, including for example libraries 106, schematics 108, and designs 112, may be stored in a computer readable storage medium 122. The computer readable storage medium 122 includes any combination of hardware and/or software that allows for ready access to the data that is located at the computer readable storage medium 122. For example, computer readable storage medium 122 could be implemented as computer memory and/or hard drive storage operatively managed by an operating system, and/or remote storage in a networked storage device, such as networked attached storage (NAS), storage area network (SAN), or cloud storage. The computer readable storage medium 122 could also be implemented as an electronic database system having storage on persistent and/or non-persistent storage.

This disclosure will now briefly provide an overview of row-based electronic design techniques. Following the description of row-based designs, this disclosure will then provide a detailed description of an inventive approach to implement automated placement and re-placement of objects.

Row-Based Electronic Designs

Modern integrated circuit designs allow certain specific arrangements of devices (e.g., N-P-P-N or P-N-N-P arrangements of transistors). These devices in these specific arrangements of devices may have different heights, different structures, and/or different spacing values in between. On the other hand, conventional placement tools only allow placement of standard cells having the same height. In addition, conventional approaches require intensive computational resources as well as human efforts to manually arrange devices having different height values during placement. In an example including devices having different height values, a placement tool may iterate through a plurality of processing with extensive inputs and manipulations by a designer to place these devices.

For example, a placement tool may arrange these devices in a certain pattern but to subsequently find that the pattern violates certain rules or requirements and thus does not result in a legal placement layout or floorplan. Examples of such violations may include a determination that the pattern is not permitted by some manufacturing requirements, a device in the pattern being placed in a prohibited orientation or a device being placed in a location that does not align one or more grids (e.g., poly grids for polysilicon gates, fin grids for multi-gate devices, etc.) of the device (e.g., an instance of a cell) with the one or more corresponding grids defined for the placement layout or floorplan. Other examples of such violations may include a device being placed at a location that fails to observe the site definition (e.g., siteDEF), In addition, a device may be placed at a location in one of multiple possible orientations where some or all of these multiple possible orientations lead to legal placement of the device. These multiple legal orientations, when coupled with the aforementioned alignment or positioning requirements, further complicate the placement. For example, a device may be placed in a first orientation at a location that results in illegal placement of the device in the placement layout or floorplan. Nonetheless, the same device may be placed in a second orientation at the same location that results in legal placement of the device. In this example, the illegal placement of the device may be fixed by simply rotating the device. Nonetheless, the alignment and/or positioning of the device, when coupled with the orientation, may cause the placement tool to waste much more computational resources to repeatedly trying different placement options before finally arriving at a legal placement result.

The problems of conventional approaches with requiring intensive computation is further exacerbated when a certain arrangement of devices is repeated in a portion of the placement layout. For example, in integrated circuit designs such as memory cells, a pattern or arrangement of devices may be repeated several times to fill a region in the layout. With the conventional approaches, an error in one pattern or arrangement needs to be fixed multiple times so that the repeated patterns or arrangements are legal.

These issues are even more problematic in advanced technology nodes (e.g., 14 nm and below) that permit only a limited number of legal track patterns and a number of permissible width values. A legal track pattern includes a plurality of routing tracks that are associated with a permissible combination of width values. For example, the advanced technology nodes may require that a routing track associated with 34 nm width cannot be located immediately adjacent to another routing track associated with a width value of 58 nm or greater. Placement tools thus need to address not only the aforementioned complexities but also conform to the limited number of legal track patterns.

To address shortcomings of conventional approaches for placing instances of standard cells and custom blocks in a placement layout or floorplan, various embodiments described herein identify a placement region or a place and route boundary in a layout canvas or a floorplan. An object may be created and stored in a data structure (e.g., a database) for the placement region or the place and route boundary as a "row region" in some embodiments. A row region may represent a geometric area of the layout or floorplan in the canvas and may be identified in a variety of different manners. For example, a user may specify a placement region or place and route region in a layout canvas or a floorplan, and an EDA module (e.g., a placement module) may create a row region representing the extent of the specified placement region or place and route region. The EDA module may also provide a default region that may be further customized or configured by a designer in some embodiments. In some embodiments, a row region may be created and stored as an object (e.g., a physical object) that is associated with, for example, its identifier, the extent of the placement region or placement and route region, etc. In some other embodiments, a row region may be created and stored as a reference that is also associated with the same information as does the object. The object or reference of a row region may be stored in a data structure (e.g., a list, a table, a database table, etc.) for subsequent reuse.

A row region may include a rectilinear shape having a plurality of vertices and boundary segments and thus may be stored in various different manners that are not intended to limit the scope of row regions. For example, a row region may be stored as a set of points each corresponding to a vertex of the rectilinear shape. As another example, a rectangular row region may be stored as a reference origin, a length value, and a width value. At this stage, a row region may simply be represented as the geometric area in the canvas with no rows created therein or characteristics associated therewith.

In some embodiments, one or rows may be created by applying a row template to the row region, and one or more characteristics for each of the one or more rows may be stored in or associated with the one or more rows or the row region itself as described in more details below. Applying a row template to a row region creates one or more rows in the row region and associates the one or more rows with their respective characteristics, attributes, or configuration. In some embodiments where a row is created as an object, these characteristics, attributes, or configuration may be stored in the object. In some other embodiments where a row is created as a row reference, these characteristics, attributes, or configuration may be associated with the row reference. These respective characteristics, attributes, or configuration stored in or associated with each row may be subsequently queried by placement commands to determine one or more rows and/or one or more legal locations for placing an instance to create a legal placement layout or floorplan. One or more attributes, characteristics, or configurations specified in the row template for a row may be optionally customized. Customization may be made to the row template in some embodiments or to individual rows in some other embodiments. The customization to a row template may occur before or after a row template is applied to a row region. In some embodiments where the customization of a row template occurs after the application of the row template to a row region, one or more rows are generated in the row region based on the row template before customization and will thus be re-generated with the customized row template. It shall be noted that regeneration of rows after a row template is customized or modified may apply to all the rows generated with the non-customized row template in some embodiments or only to one or more rows whose attributes, characteristics, or configurations have been affected by the customization in some other embodiments. In some other embodiments where the customization of a row template occurs before the application of the row template to a row region, one or more rows are generated in the row region based on the already customized row template and will not be regenerated.

After the row template is applied to the row region, a placement module may issue one or more placement commands to place one or more instances into their respective rows in the row region as guided by the row template. As described above, a row may allow one or more specific types of circuit components or devices, and thus an instance of a specific type may not necessarily be inserted into any row in a row region. In some embodiments where instances are to be snapped to their respective legal locations in a row region in an automatic, interactive, or assisted placement task, the placement modules may leverage various snapping techniques.

The row-based design may correspond to one or more reference grids. A reference grid may be identified from the manufacturing grids that are often provided by the manufacturers (e.g., a foundry) and consist of both horizontal and vertical grids at a small spacing value (e.g., 1 or 2 nanometers) and may be used to position various entities (e.g., rows, layout circuit component designs, layout devices, cells, blocks, etc.) in a layout. In some embodiments, a reference grid in the horizontal direction (hereinafter reference Y grid) and a reference grid in the vertical direction (hereinafter reference X grid) may be identified. A reference grid includes a set of parallel reference lines or line segments at a spacing value that is larger than that of the manufacturing grids. An intersection of the reference X and reference Y grids may be identified as the relative origin for the placement region or place and route boundary. The reference X grid and reference Y grid may be independently identified from the manufacturing grids in some embodiments or may be identified from one or more sets of grids that may also be provided by the manufacturers in some other embodiments. For example, an integrated circuit (IC) manufacturer may provide a fin grid for multigate MOSFET (metal-oxide-semiconductor field-effect transistor) such as a FinFET (Fin Field Effect Transistor) or other non-planar or three-dimensional transistors, a poly grid for aligning polysilicon gates, a global fin grid, a global poly grid, etc. in one or both routing directions. The reference X grid and reference Y grid may be identified from one or more of the aforementioned grids in some embodiments. With the reference grids identified, the row region identified or created may be automatically snapped to the reference grids. For example, a vertex of the row region (e.g., the lower left vertex of a rectangular row region) may be snapped to the origin of the reference grids or to another intersection between the reference grids. Snapping the row region may or may not alter (e.g., enlarging, shrinking, or changing the shape) the geometries of the row region.

A row template may be identified from a repository, modified from an existing row template in the repository, or created anew. A plurality of characteristics, attributes, or configurations may be identified for the row region from the row templated identified or created. These characteristics, attributes, or configurations may include one or more of, for example, the number of rows in the row template, the reference grids, the positive or negative reference X grid offset, the positive or negative reference Y grid offset, the height of a row in the row template, one or more allowed types of circuit components or devices for a row in the row template, or one or more permissible orientations. These one or more permissible orientations may include, for example, horizontal, vertical, rotating by 0-degree (R0), 90-degree (R90), 180-degree (R180), or 270-degree (R270), mirroring against the reference X grid (MX), mirroring against the reference Y grid (MY), etc. of a circuit component or device when placed in a specific row. It shall be noted that the same circuit component or device may have identical or different orientation(s) when placed in different rows. A row template may include one or more rows. When a row template is applied to a row region, these one or more rows will be created in the row region. A row region on the other hand, may have a different height than the row template. A determination may be optionally made to decide how to fill the row region with the row template. When applying a row template to a row region, the entire rows or some but not all of the rows in the row template may be created in the row region. In some embodiments where the height of the row region is larger than that of the row template, the row template may be repeated an integral multiple of times to fill the row regions with the rows in the row template with the option of filling the remaining space in the row region, if any, with some but not all of the rows in the row template.

A placement command may be invoked by, for example, an interactive, assisted, or automatic placement to place the instance in the layout. When the row template is applied to the row region, one or more rows are created in the row region according to the row template, and characteristics, attributes, or configurations pertaining to these one or more rows are associated with or stored in the corresponding rows. The placement command may then query these characteristics, attributes, or configurations of the one or more rows created in the row region to obtain relevant information about these one or more rows. This relevant information in the query results may then be compared with the one or more instance characteristics identified to identify one or more candidate rows and/or one or more candidate locations. For example, a first row in the row region may allow only NMOS, and the second row may allow only PMOS. In determining a candidate row for placing an NMOS, a placement command may query both the first and second rows to identify the permissible device type characteristic and then select the first row as the candidate row. In some embodiments where more than one candidate row are identified, the placement command may insert the instance into the candidate row or the candidate location that is closest to the instance in an interactive placement mode where a designer may attempt to place the instance by drag an instance into the layout. A candidate location is a legal location that satisfies one or more design rules so that placing the instance at the candidate location results in a legal placement layout. A candidate location may be determined based in part or in whole upon, for example, one or more grids, alignment requirements, track pattern rules, spacing rules, etc. For example, a legal location may be identified for an instance of a FinFET by identifying the legal location such that the fin grid in the FinFET instance is aligned with the FinFET in a candidate row, and various metal shapes of various widths in the FinFET will be located along their corresponding routing tracks in a legal track pattern in the candidate row. The placement command may then insert the instance into a candidate row or at a candidate location in a candidate row. The instance is inserted in such a way to satisfy pertinent characteristics, attributes, or configurations. For example, a candidate row may be associated with or may store therein alignment characteristic(s), alignment offset characteristic(s), permissible orientation(s), instance pitch, site definition, or any other characteristics, attributes, or configurations. The placement command may then orient the instance to satisfy the permissible orientation(s) and identify the legal position to satisfy the alignment, offset, instance pitch, or site definition.

Figure 2:
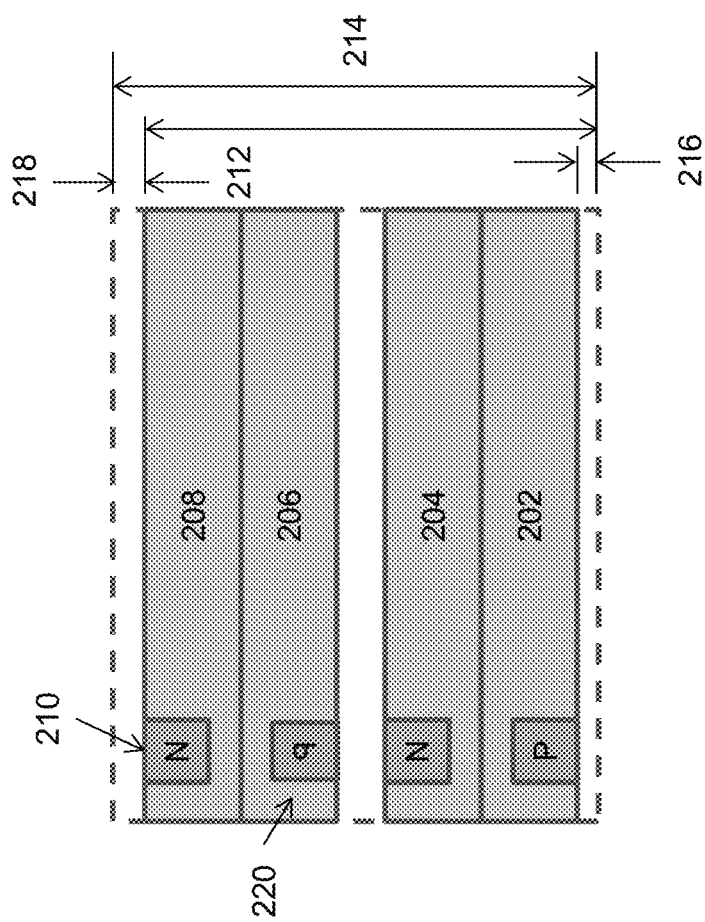
FIG. 2 illustrates a simplified example of rows and row templates in some embodiments.

FIG. 2 illustrates a simplified example of rows and row templates in some embodiments. This simplified example includes four rows—row0 202, row1 204, row2 206, and row3 208—within the template having a template height 214. Row0 is specified in the row template at the row0 offset 216 from the bottom of the row template. This row0 offset 216 may again be used to specify the offset from the top of the row template when this template is repeated in a row region. As graphically indicated in this figure, each row may store or be associated with a permissible device type, permissible orientation, an alignment characteristic for devices to be placed in the row. In this illustrated example, the NMOS (n-type metal-oxide-semiconductor) device 210 in row 208 is shown to be in the permissible orientation of R0 (rotation by zero degree); and the PMOS (p-type metal-oxide-semiconductor) device 220 in row 206 is shown to be in the permissible orientation of R270 (MY~mirrored around the Y axis).

Further details regarding approaches to implement a row-based design are described in co-pending U.S. patent application Ser. No. 15/396,156, U.S. patent application Ser. No. 15/396,178, and U.S. patent application Ser. No. 15/396,229, all filed on Dec. 30, 2016, and all of which are hereby incorporated by reference in their entirety.

Placement of Objects in an Electronic Design

Figure 3:
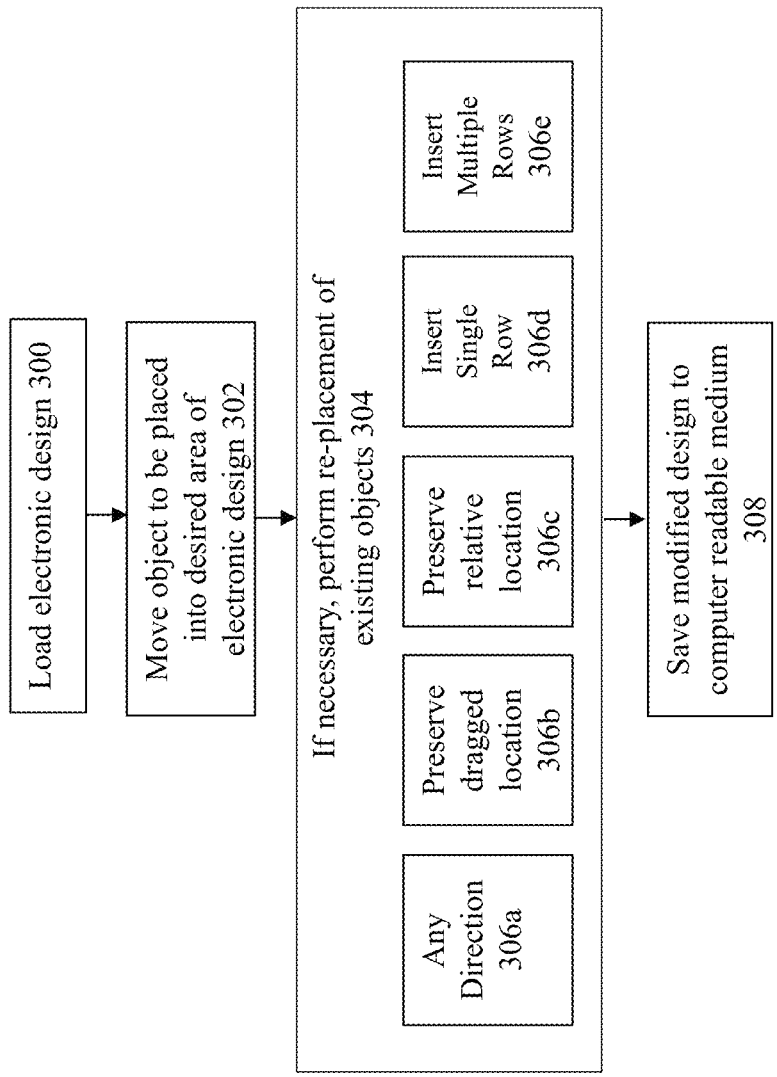
FIG. 3 shows a flowchart of an approach for implementing placement for an electronic design in some embodiments.

FIG. 3 shows a flowchart of an approach for implementing placement for an electronic design, where when dragging an object to a desired area, existing objects in that location are automatically moved as necessary in correspondence to the movement of the dragged object.

At 300, an electronic design is loaded into the EDA system, e.g., a row-based design where objects/instances have been placed into some or all of the row sections of the layout. The electronic design is loaded to allow interactive editing of the design, e.g., to move objects and/or insert objects within the design. While the current embodiment is usable with row-based designs, it is noted that the inventive concepts disclosed herein are not restricted in its scope only to row-based implementations, unless explicitly claimed as such. Therefore, while the current description is illustrated with respect to row-based processing, it should be clear that the concepts described herein are also applicable to non-row based processing as well.

At 302, an object to be moved is placed into a desired area of the electronic design. In some embodiments, this occurs interactively when a user manually edits the design to insert and/or move the object to a specific portion of the design. The UI is configured to permit the user to select a specific object and to drag that object to a location on the layout, e.g., where a ghosted image of the object is visually displayed on the UI as a mouse pointer/cursor is manipulated by the user to different portions of the screen.

As the object is moved to different locations, it is possible that the object will overlap with other objects that already exist in given locations on the layout. In real-time, visual aids are provided to the user to determine whether, at any particular dragged location for a dragged object (even when it has not yet been "dropped but is still moving across the screen), other objects will be re-placed to other locations on the layout. Specifically, as the dragged object is being moved, at each moved location, there may be different combinations of existing objects that will need to be moved due to overlaps at that location with the dragged object. For each of those dragged locations, those existing objects are placed if necessary to a different location (304). The moved locations for the existing objects are visually displayed on the user interface so that the user receives real-time feedback about the expected location(s) of the various objects if it is desired to drop the dragged object to that location.

Therefore, a real-time image is provided that shows the location of the dragged object, along with the possible new location(s) of existing objects that are displaced as a result of movement of the dragged object to a given location.

Additional visual elements may be provided to enhance the information presentation to the user. For example, arrows may be displayed showing the direction of movement of a given object, where the head of the arrow shows the new midpoint location of the moved object, the start location of the arrow line identifies the original midpoint of the object, and the length of the arrow corresponds to the amount of movement/displacement of the object. In addition, information balloons may be provided, e.g., to report the net effect on estimated wire lengths as a result of the object movement.

A number of different modes may be provided for placement of existing objects. For example, at 306*a*, the "any direction" mode may be performed to move objects in any direction, including to the current row or to a different row. In contrast, modes 306*b* and 306*c* may be performed to move objects only within the current row, e.g., only in the X-direction for horizontal-based rows or only in the Y-direction for vertical-direction rows. Mode 306*b* ("preserve dragged location") is performed to preserve the user-desired location that the dragged object is dragged to, where existing objects are moved to preserve that dragged location. In contrast, mode 306*c* ("preserve relative location") may not necessarily preserve the exact location at which the dragged object is placed, but will preserve the relative location of that dragged object to other objects. Modes 306*d* and 306*e* both pertain to "insert" of objects. Mode 306*d* ("insert single row") is performed when multiple objects over multiple rows are selected, but they are placed onto a single row for insertion. In contrast, mode 306*e* ("insert multiple rows") is selected when multiple objects over multiple rows are selected, and they are placed onto multiple rows for insertion. Each of these modes is described in more detail below.

In some embodiments, the visually displayed object locations are ephemeral, where the actual placement changes are committed to the design database only when the command is completed. Therefore, as the user manipulates a dragged object to different locations on the layout, the visual presentation of the object locations (both dragged object and existing objects that are re-placed as a result of movement of the dragged object) are not persisted during the real-time movement of the dragged object. Instead, only upon intent of the user to preserve a changed location (e.g., by "dropping" the object to a specific location by release of a mouse button) is the modified design saved to the database (308).

Figure 4:
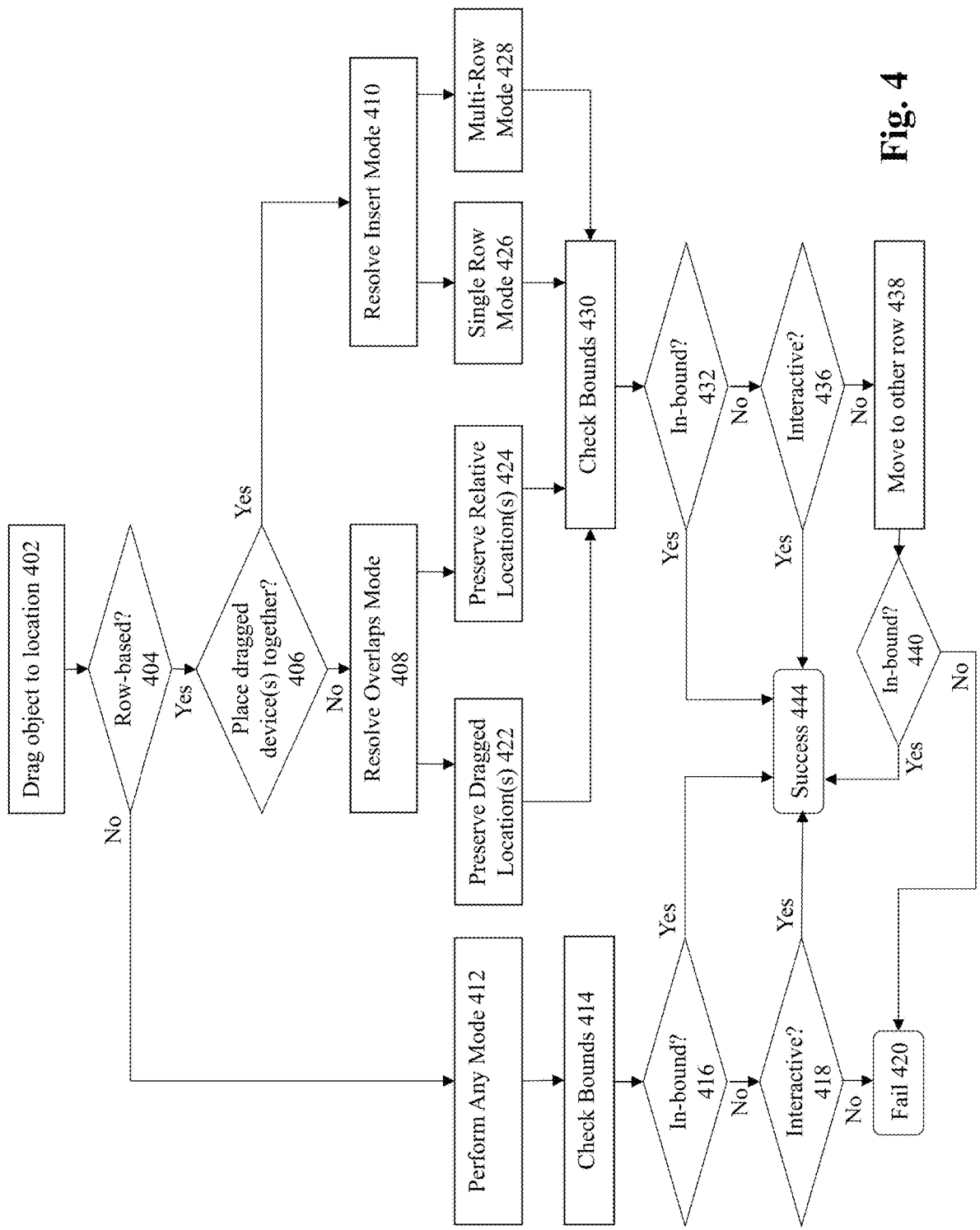
FIG. 4 shows a more detailed flowchart of an approach for implementing placement for an electronic design in some embodiments.

FIG. 4 shows a more detailed flowchart of an approach for implementing placement for an electronic design. At 402, an object is dragged to a location within the electronic design, e.g., by the user interactively moving a mouse or other pointing device to manipulate the positioning of an object on the layout.

A determination is made at 404 whether the movements of the objects is row-based, where the objects to be moved are confined within the boundaries of a given row. If not, then as described in more detail below, the "any" mode is performed. However, if the movement is row-based, then a further determination is made at 406 whether dragged devices are to be placed together.

If it is determined at 406 that the dragged devices are not to be placed together, then resolution of an overlaps mode is determined at 408. The resolution of the overlap modes determines whether at 422 dragged locations are to be preserved or whether at 424 relative locations are to be preserved.

Figure 5:
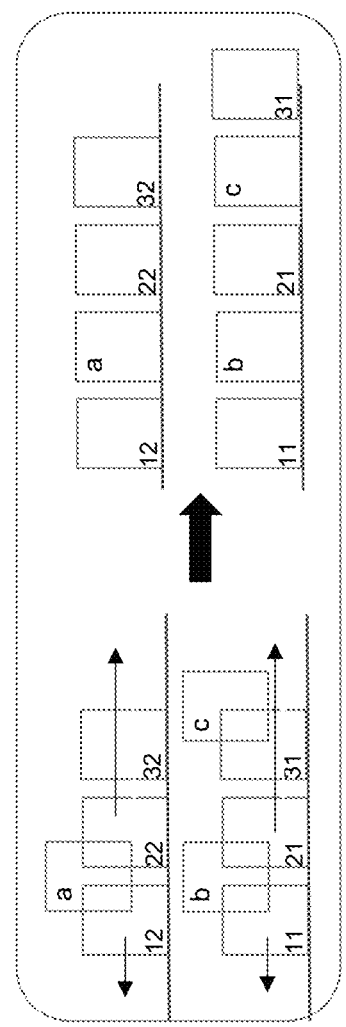
FIG. 5 illustrates the preservation of a dragged location.

FIG. 5 illustrates the preservation of dragged location (422). Here, the illustrative example shows objects that are located on two separate rows. Object "a" is an object being dragged which is located on the top row and objects "b" and 'c" are dragged objects that are located on the bottom row. Objects "12", "22", and "32" are pre-existing objects that are located on the top row, and objects "11", "21", and "31" are pre-existing objects that are located on the bottom row.

The left side of the figure shows the current dragged location of objects "a", "b", and "c". As can be seen, the current dragged location of these objects creates an overlap with pre-existing objects. In particular, on the top row, object "a" overlaps the current position of objects "12" and "22". On the bottom row, object "b" overlaps with objects "11" and "21", while object "c" overlaps with the current position of object "31".

With the mode of preserving dragged locations, the eventual movements of all objects will result in the preservation of the location to which the dragged objects are placed. The right-hand side of the figure shows possible locations for re-placements of the existing objects to make room for the dragged objects in this mode. From a comparison of the left-side and the right-hand side of the figure, it can be seen that the locations of "a", "b", and 'c" are at exactly the same locations after movements of the pre-existing objects. This means that the locations of the dragged objects "a", "b", and "c" have been preserved, while the locations of the pre-existing objects "12", "22", "32", "11", "21", and "31" have been adjusted to preserve those dragged locations of the dragged objects.

Figure 6:
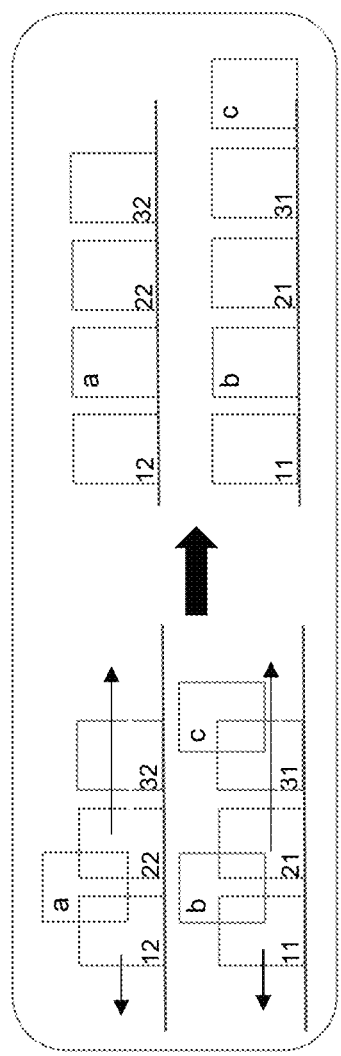
FIG. 6 illustrates the preservation of relative locations.

FIG. 6 illustrates the preservation of relative locations at 424. As before, the illustrative example shows objects that are located on two separate rows, where object "a" is an object being dragged on the top row and objects "b" and 'c" are dragged objects located on the bottom row. Objects "12", "22", and "32" are pre-existing objects on the top row, and objects "11", "21", and "31" are pre-existing objects on the bottom row. The left side of the figure shows the current dragged location of objects "a", "b", and "c", where object "a" overlaps the current position of objects "12" and "22" on the top row, and on the bottom row, object "b" overlaps with objects "11" and "21" while object "c" overlaps with the current position of object "31".

With the mode of preserving relative locations, the eventual movements of all objects will not necessarily result in the preservation of the exact locations to which the dragged objects are placed. Instead, only the relative positions of the dragged objects to the pre-existing objects will be preserved.

The right-hand side of the figure shows possible locations for re-placements of the existing objects to make room for the dragged objects in this mode. From a comparison of the left-side and the right-hand side of the figure, it can be seen that the locations of the dragged objects "a", "b", and 'c" are not at the same exact locations after movements of the pre-existing objects. For example, it can be seen that object "c" on the right-hand side is not at the same exact location as its dragged location on the left-hand side (it has been shifted farther to the right). Instead, the movements of some or all of the objects have been shifted to allow for the dragged objects to be placed, but the new position of object "c" has been shifted from its dragged location in the final configuration. Here, even though object "c" on the right-hand side did not have its dragged location preserved, its positioning relative to the other objects have been preserved. For example, the left-hand side has the order of elements being "11", "b", "21", "31", and then "c". On the right-hand side, the order of elements is still "11", "b", "21", "31", and then "c". This means that the locations of the dragged objects relative to the other objects has been preserved.

Returning back to FIG. 4, if it is determined at 406 that the dragged devices are to be placed together, then resolution of an insert mode is determined at 410. The resolution of the insert modes determines whether at 426 a single row mode is performed or whether at 428 multi-row mode is performed.

Figure 7:
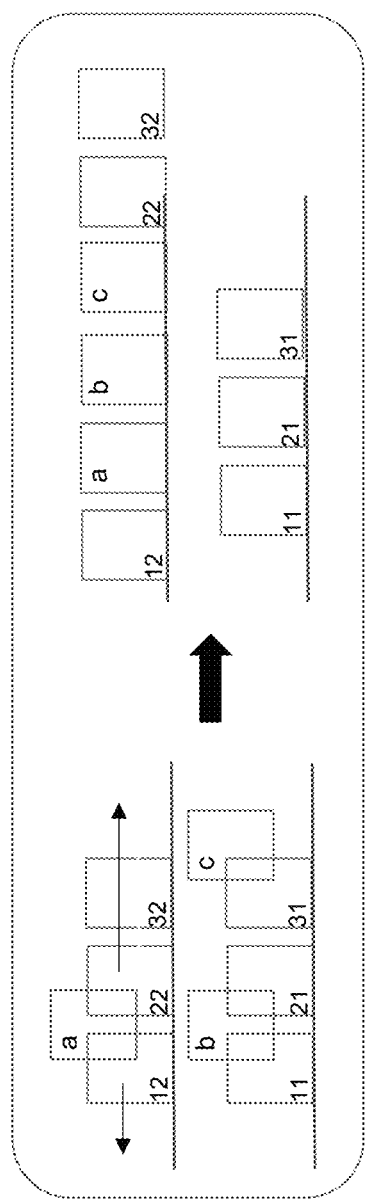
FIG. 7 illustrates a mode for insert of a single row.

With the mode of inserting a single row at 426, all of the dragged objects from multiple rows are collected together and are inserted into a single row. This mode is illustrated in FIG. 7, where as before, the left-hand side shows the dragged locations of dragged objects "a", "b", and "c". Here, the illustrative example shows objects that are located on two separate rows, where object "a" is an object being dragged on the top row and objects "b" and 'c" are dragged objects located on the bottom row. Objects "12", "22", and "32" are pre-existing objects on the top row, and objects "11", "21", and "31" are pre-existing objects on the bottom row. The left side of the figure shows the current dragged location of objects "a", "b", and "c", where object "a" overlaps the current position of objects "12" and "22" on the top row, and on the bottom row, object "b" overlaps with objects "11" and "21" while object "c" overlaps with the current position of object "31".

The right-hand side of the figure shows possible locations for movements of the various objects. Here, the dragged objects "a", "b", and 'c" are originally from two separate rows (as shown on the left-hand side of the figure), but when moved, they are all placed onto a single row—where 'a", "b" and "c" all are inserted together on the top row as shown in the right-hand side of the figure. The pre-existing objects "12", "22", and "32" on the top row are shifted to make room for the inserted objects "a", "b", and 'c".

With the mode of inserting a multiple row at 428, the dragged objects from multiple rows are inserted into respective multiple rows in the moved configuration. This means that unlike the approach of mode 426, mode 428 will insert objects into multiple rows.

Figure 8:
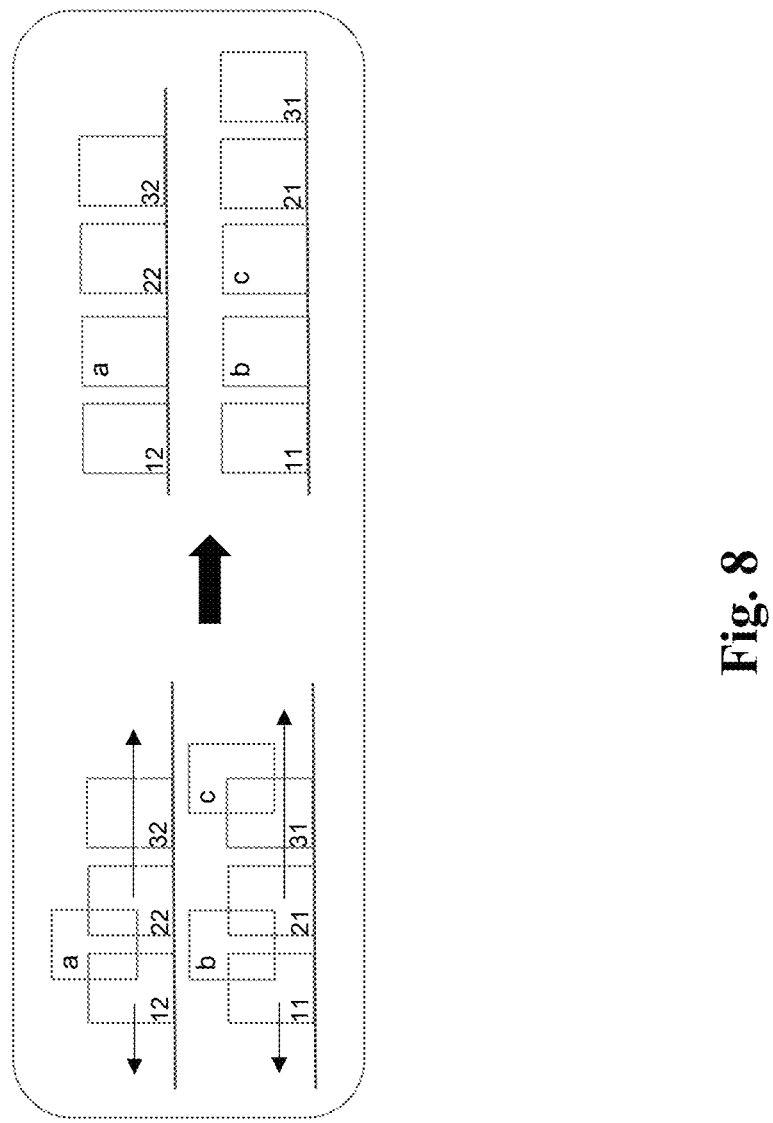
FIG. 8 illustrates a mode for insert of multiple rows.

This mode is illustrated in FIG. 8, where as before, the left-hand side shows the dragged locations of dragged objects "a", "b", and "c", where object "a" is an object being dragged on the top row and objects "b" and 'c" are dragged objects located on the bottom row. Objects "12", "22", and "32" are pre-existing objects on the top row, and objects "11", "21", and "31" are pre-existing objects on the bottom row. The left side of the figure shows the current dragged location of objects "a", "b", and "c", where object "a" overlaps the current position of objects "12" and "22" on the top row, and on the bottom row, object "b" overlaps with objects "11" and "21" while object "c" overlaps with the current position of object "31".

The right-hand side of the figure shows possible locations for movements of the various objects. Here, the dragged objects "a", "b", and 'c" are originally from two separate rows (as shown on the left-hand side of the figure), and when moved, they are still placed onto multiple rows. However, shapes on the same row are collapsed together to be moved as a single group of objects. In particular, the dragged objects "b" and 'c" on the bottom row are placed together when moved, and as shown in the right-hand side of the figure, are placed together on the bottom row with the other objects "11", "21", and "31" being shifted to make room for the dragged objects "b" and 'c".

Returning back to FIG. 4, the completion of steps 422, 424, 426, and 428 are followed by step 430 to check whether the resulting configuration of objects are in-bounds or out-of-bounds. In some embodiments, it is possible for at least some of the moved objects to extend beyond the boundary of a row section. If in-bounds, then the process proceeds to a success point at 444. However, if out-of-bounds, then a determination is made at 436 whether the current EDA application is an interactive application.

The general idea is that for interactive placement tools, the user should be permitted to view placement configurations where objects are out-of-bounds of a row. This is because the rows may still be under construction at the current stage of the design activity, and hence the design could still be later modified to correct any out-of-bounds problems (e.g., by expanding the boundary of the row). In addition, this permits more predictable results for the user to allow objects that are expected to be moved within a row to remain within that given row, even if some of the objects may be out-of-bounds (instead of moving objects to another row). Therefore, for an interactive application, the process would proceed to the success state at 444 even if some of the objects may be out-of-bounds.

Figure 9A:
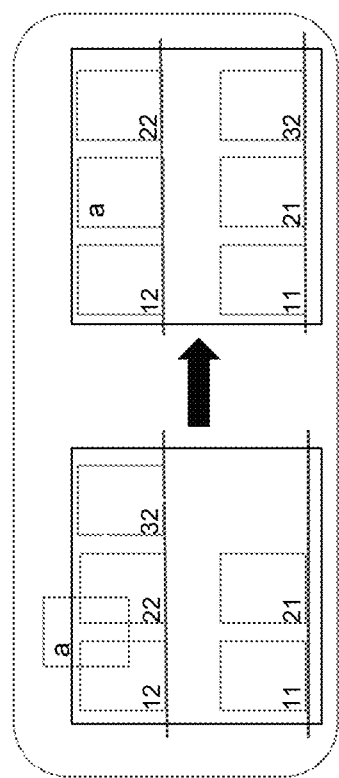
FIG. 9A illustrates movement of objects across rows.

For non-interactive applications, the process in some embodiments proceeds to step 438 to move one or more objects to another row. For example, as shown in FIG. 9A, when object "a" is dragged into the position shown in the left-hand side of the figure, an overlap exists between object "a" and objects "12" and "22". Assume that this overlap requires the displacement of objects "12", "22", and "32" on the top row, but that there is insufficient room within the boundaries of the top row to fit all four objects "a", "12", "22", and "32". In this situation, as shown in the right-hand side of the figure, one of the pre-existing objects (e.g., object "32") is moved to the bottom row to make sure none of the objects are placed out-of-bounds of the rows. As described in more detail below, the "any direction" mode can be executed to shift an object to another row.

The process of FIG. 4 then proceeds to step 440 to determine again whether any objects are out-of-bounds or if all objects are in-bounds. If all objects are in-bounds, then the process proceeds to a success state at 444. If any objects are still out-of-bounds, then the process proceeds to a fail state at 420.

In some embodiments, a failed state can be addressed by providing visual feedback in the user interface. One approach is to provide a visual indicator of the failure, e.g., by placing an "X" mark at a location where an overlap cannot be resolved. For example, consider the situation when a user attempts to drag a first instance that overlaps with a second fixed instance that cannot be moved. In this situation, an "X" mark can be placed on the overlapped fixed instance, suggesting that there is no legal solution at the current dragged location.

If it was determined at 404 that the movements of the objects are not row-based, then the "any direction" mode is performed at step 412. This mode permits an object to be moved in any direction, whether onto the same row, to another row, or to any desired location in non-row-based configurations.

Figure 9B:
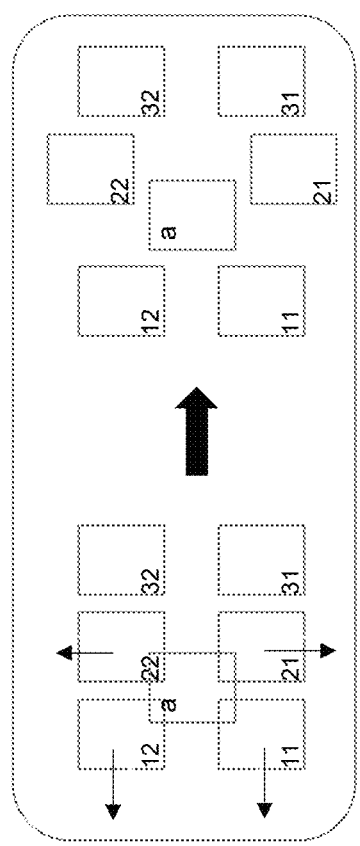
FIG. 9B illustrates movement of objects in any direction.

FIG. 9B illustrates this embodiment of the invention. As shown on the left-hand side of the figure, object "a" is dragged to a location that overlaps multiple other objects (objects "12", "22", "11", and "21"). Because the objects can be shifted in any direction, the objects are shifted as desired (and not necessarily within an original row) to make room for the dragged object. Therefore, as shown in the right-hand side of the figure, objects "12", "22", "11" and "21" have been moved in various directions to create enough space to place object 'a" at its dragged location.

Returning back to FIG. 4, the completion of step 412 is followed by step 416 to check whether the resulting configuration of objects are in-bounds or out-of-bounds. If in-bounds, then the process proceeds to a success point at

444. However, if out-of-bounds, then a determination is made at 436 whether the current EDA application is an interactive application. If so, then the process proceeds to the success point at 444. If not, then the process proceeds to a fail state at step 420.

Figure 10:
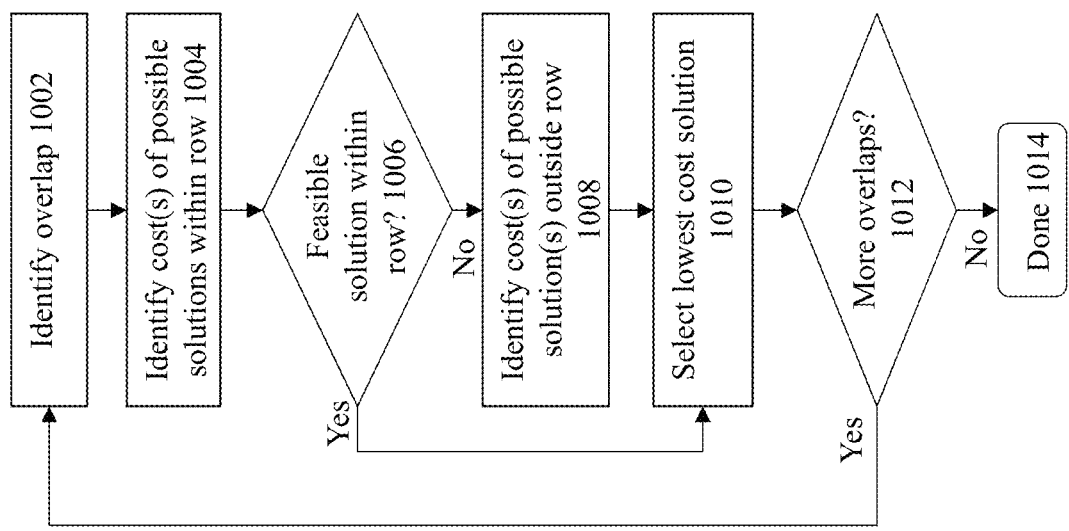
FIG. 10 shows a detailed flowchart of an approach to move existing objects according to some embodiments of the invention.

FIG. 10 shows a detailed flowchart of an approach to move existing objects according to some embodiments of the invention, where objects can be moved in any direction to resolve overlaps. This embodiment takes a greedy, cost-based approach to shift the location of objects within the layout. Existing instances are only moved if they are causing a spacing violation or overlap with the instance being moved, either directly or indirectly. When the user moves the dragged object to be placed in the desired area and the existing instances are re-placed, some or all the following objectives in mind can considered: (a) minimum perturbation; (b) wire length improvement; (c) design rule correctness; (d) placement constraints; and/or (e) respecting device and metal grids.

When a dragged object is moved to a dragged location, that dragged location may cause an overlap with one or more pre-existing objects in the layout. At 1002, one of the resultant overlaps is selected to be resolved. Any suitable approach can be taken to perform this selection of an overlap to resolve. For example, a simple left-to-right ordering of overlaps can be taken to select an overlap, where overlaps are handled from the left-most overlap towards the right-most overlaps. An alternative approach can be taken where the order of overlaps is configured for selection on the basis of an estimate of the most efficient ordering, e.g., where the ordering is based upon an estimate of least cost for object movements for a given order.

For the selected overlap, costs are calculated for possible solutions to resolve that overlap within the row. In other words, different possible movements of the overlapped object within the row are considered, where a cost is calculated for each possible movement possibility within the row. The following is an example cost calculation that can be performed in some embodiments:

$$\text{Cost} = W_1 C_{overlap} + W_2 C_{perturbation} + W_3 C_{wirelength} + W_4 C_{constraints} + W_5 C_{DRC} + \ldots W_n C_{other}$$

This cost equation considers the cost of various factors (represented in the equation as the letter "C") in determining the estimated cost of a given movement option. The overlap cost includes a cost value associated with the overlaps that exist for a given movement option, e.g., where a first movement option that retains the original overlap will have a higher cost than a second movement option that resolves the overlap. In addition, the overlap cost could include the estimated cost of a chained series of object movements that need to occur because of additional overlaps caused by the initial movement. For example, a given movement of a first object may cause another overlap between the first-moved object with second object requiring that second object to be moved, where that second-moved object causes an overlap with a third object that needs to be moved, and so on in a chain of object movements. In many situations, a movement option that is estimated to cause less objects to be moved will have a lower cost than an alternative option that is estimated to cause more objects to be moved. However, this is not always true, since sometimes moving multiple objects a small distance can be less costly than moving a single object too far from its ideal location.

The perturbation cost pertains to the amount of displacement of object(s) due to a movement option, where the cost is greater for larger amounts of object displacement and the cost is lower for smaller amounts of object displacement. The wirelength cost corresponds to the wirelength associated with a given movement option, where this cost factor is higher for an option that creates longer wirelengths and the cost factor is lower for an option that creates shorter wirelengths. The constraints cost corresponds to any placement constraints that may exist for the design. Such constraints include, for example, alignment or symmetry constraints that may be imposed on the design. In addition, certain pre-existing objects may be placed at "locked" or "fixed" specific locations in the layout, and hence there is a very high cost to options that seek to move these locked objects. The DRC-related costs pertain to the design rule correctness of a given movement option, where a DRC-correct solution has a lower cost as compared to an option that has one or more DRC violations. Any suitable additional cost factors can be included into the cost equation. For example, an additional cost factor can be included that considers device and metal grids in the design. Any of the cost factors may be associated with a weighting value (represented with the letter "W" in the equation), to weight the relative importance or contribution of a given factor to the overall cost.

A determination is made at 1006 whether any of the in-row solutions are feasible to resolve the overlap. If the answer is "yes", then the lowest cost solution is selected at step 1010. If the answer is "no", then step 1008 is performed to identify possible solutions that involve movements between rows. Costs are calculated for the different inter-row movement options, with the lowest cost solution selected at 1010.

At this point, the current overlap under examination is resolved with the selected movement option. At 1012, a determination is made whether there are any additional overlaps to resolve. These overlaps may include the original set of overlaps resulting from the originally dragged object, as well as any additional overlaps that have been created by the selected solution of step 1010. If any overlaps still exists, then the process returns to step 1002 to identify a next overlap for resolution. The process then continues until all overlaps have been resolved. This process is a greedy process, since it selects an immediate best solution for a given overlap, before attending to additional overlaps for resolution.

Figure 11A:
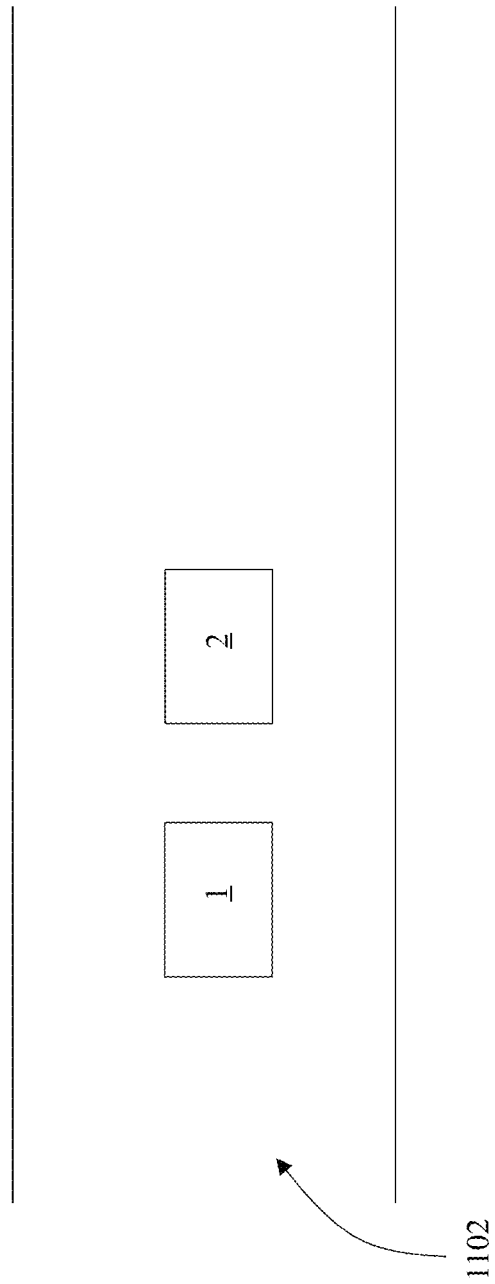
FIGS. 11A-11I provide an illustrative example of a process to move existing objects, where objects can be moved in any direction to resolve overlaps.
Figure 11B:
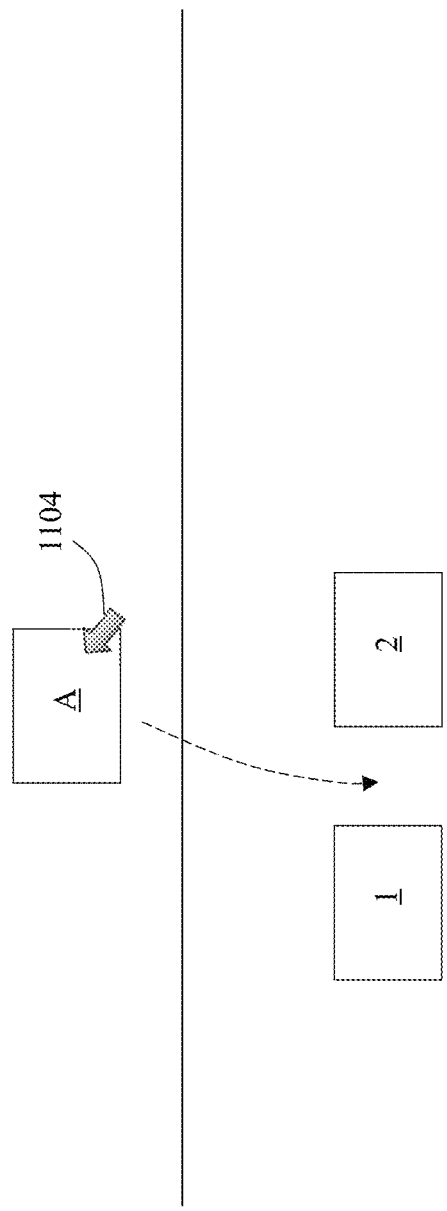
Figure 11C:
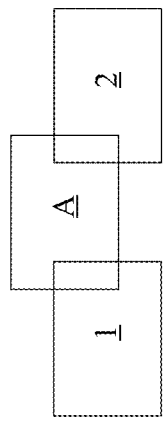

FIGS. 11A-11I provide an illustrative example of this process to move existing objects, where objects can be moved in any direction to resolve overlaps. FIG. 11A shows objects 1 and 2 that are currently located within row 1102. As illustrated in FIG. 11B, assume that a user interactively manipulates object A into a location between objects 1 and 2. A pointing device, such as mouse pointer 1104, may be used by the user to drag object A into the desired location. As illustrated in FIG. 1C, this creates an overlap between object A and pre-existing objects 1 and 2.

Figure 11D:
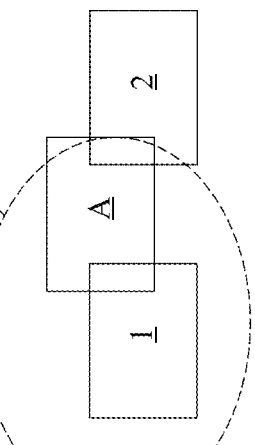

As shown in FIG. 11D, a step is taken to identify an initial overlap to revolve. Assume that a left-to-right ordering of overlaps is used to select overlaps for resolution. Therefore, the overlap between object A and object 1 is selected as the initial overlap to resolve.

Figure 11E:
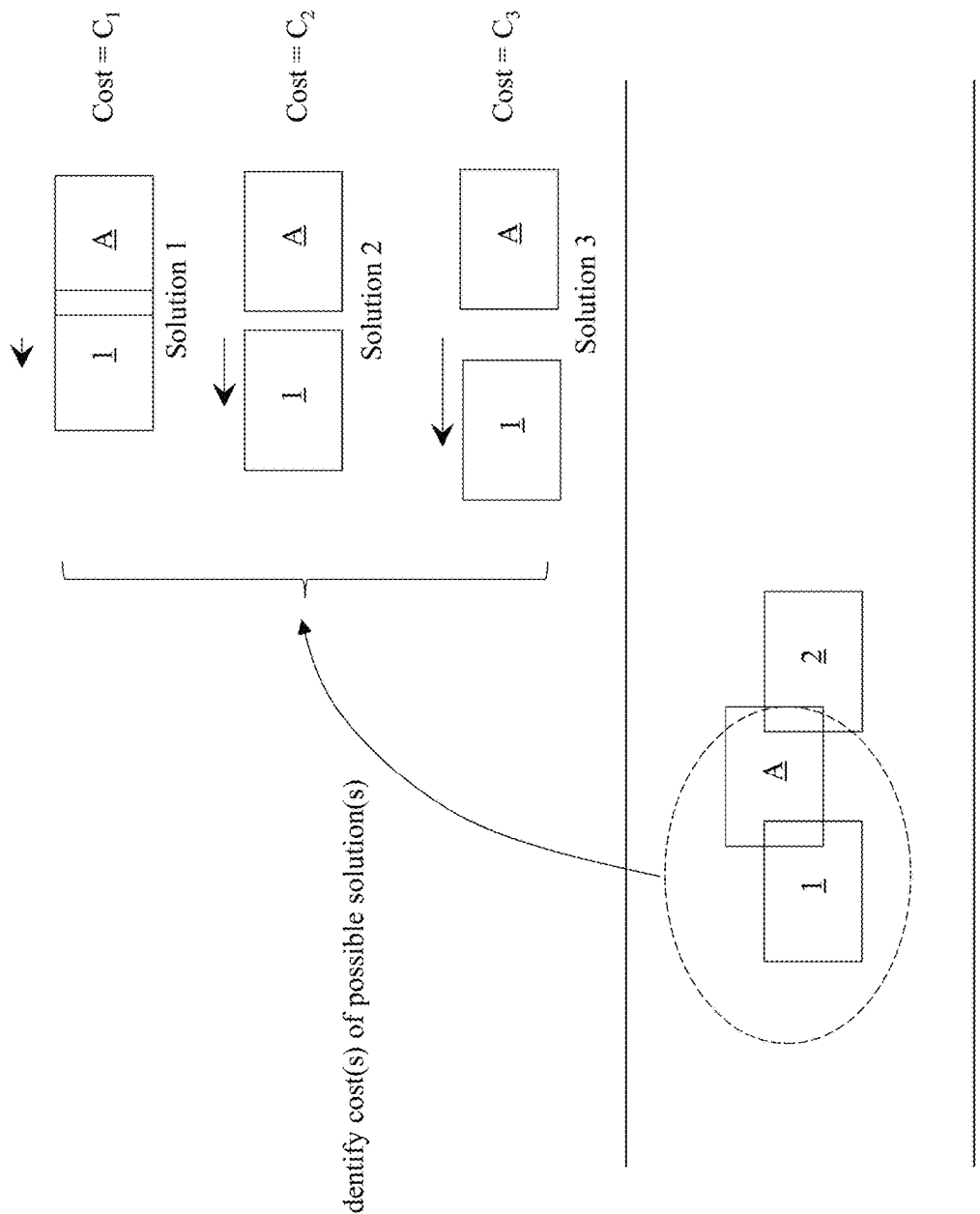

As illustrated in FIG. 11E, possible movement solutions are identified, with a cost calculated for each possible solution. This figure shows three possible movement solutions, with object 1 being moved a different distance in each solution. In particular, Solution 1 corresponds to a very small amount of movement by object 1, such that even though object 1 is moved a certain distance, there is still nonetheless an overlap between object 1 and object A. Therefore, the total cost $C_1$ that is calculated for this solution is likely to be a very high, since the $C_{overlap}$ cost factor is likely to correspond to a high cost (because an overlap still exists for this solution).

Solution 2 corresponds to a larger amount of movement by object 1 as compared to Solution 1, such that an overlap no longer exists between object 1 and object A. However, the total cost $C_2$ that is calculated for this solution is still likely to be a quite high, since the $C_{DRC}$ cost factor is likely to correspond to a high cost (because of a possible spacing rule violation due the small spacing between object 1 and object A in this solution).

Figure 11F:
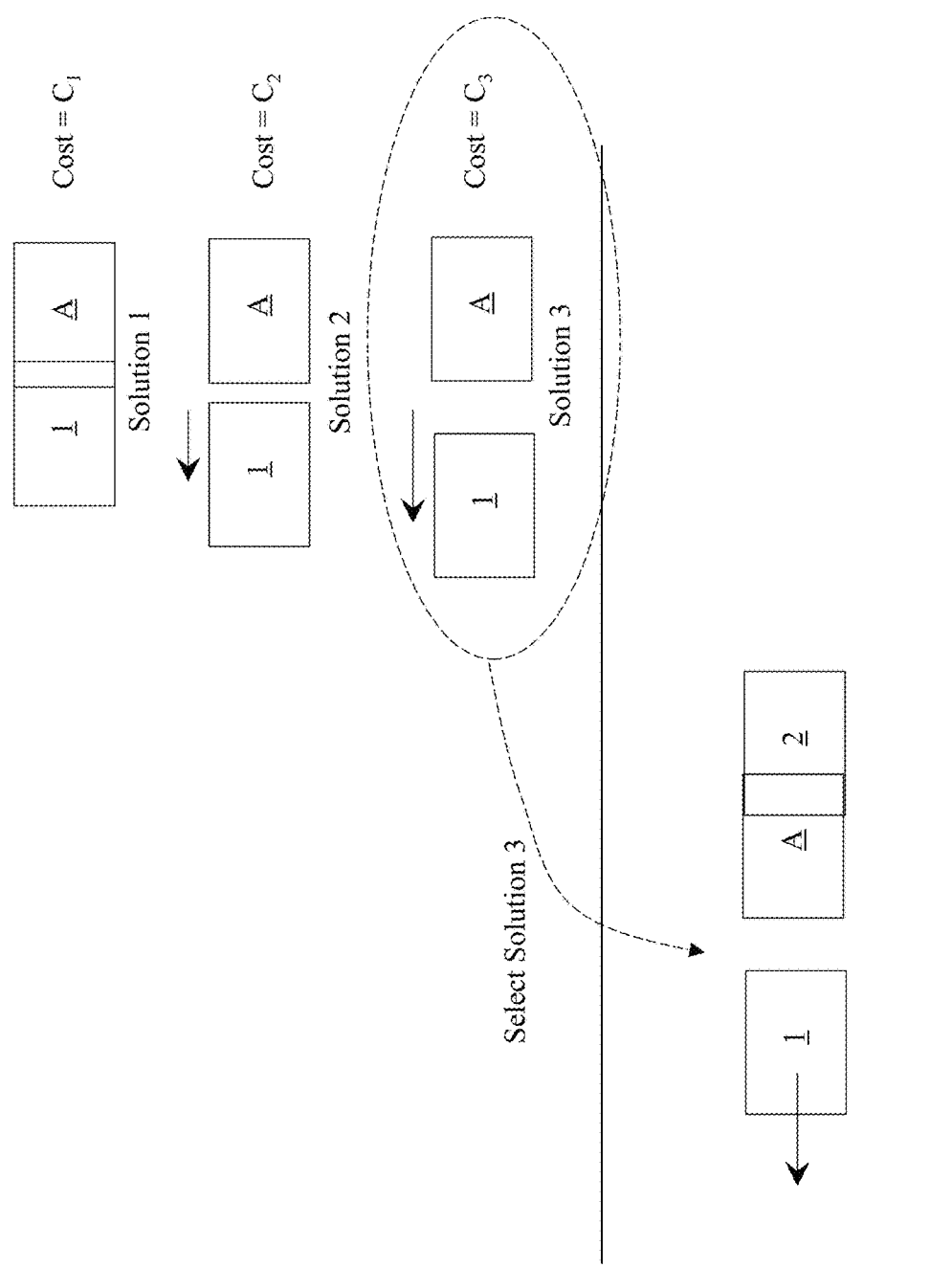

Solution 3 corresponds to an even larger amount of movement by object 1 as compared to Solutions 1 and 2. In this solution, an overlap no longer exists between object 1 and object A and it is assumed that the spacing between objects 1 and A is wide enough to avoid a spacing rule violation. The total cost $C_3$ that is calculated for Solution 3 is likely to be much smaller than the costs for Solutions 1 and 2. As such, as shown in FIG. 11F, this solution is therefore selected to resolve the overlap.

It is noted that while even greater movements by object 1 leftward may be possible for additional possible solutions, assume that these additional possible solutions (not shown) have higher costs as compared to Solution 3 due to greater cost factors associated with higher levels of perturbations/displacements for object 1. In addition, additional possible solutions (not shown) may exist for movement of object 1 in the right-ward direction, but for purposes of this illustrative example it is assumed that the costs would be higher due to greater likelihood of additional overlaps and greater object displacements when object 1 is moved in the rightwards direction.

Figure 11G:
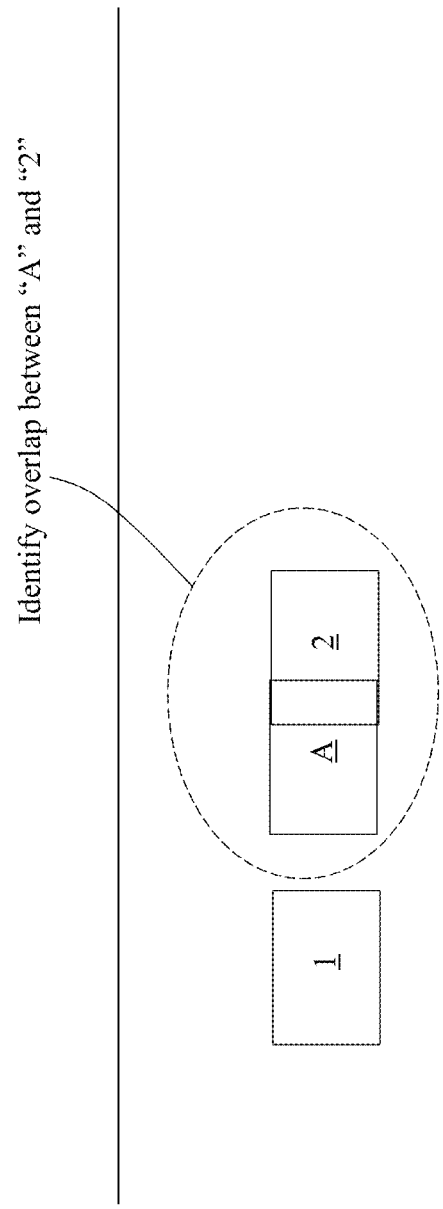
Figure 11H:
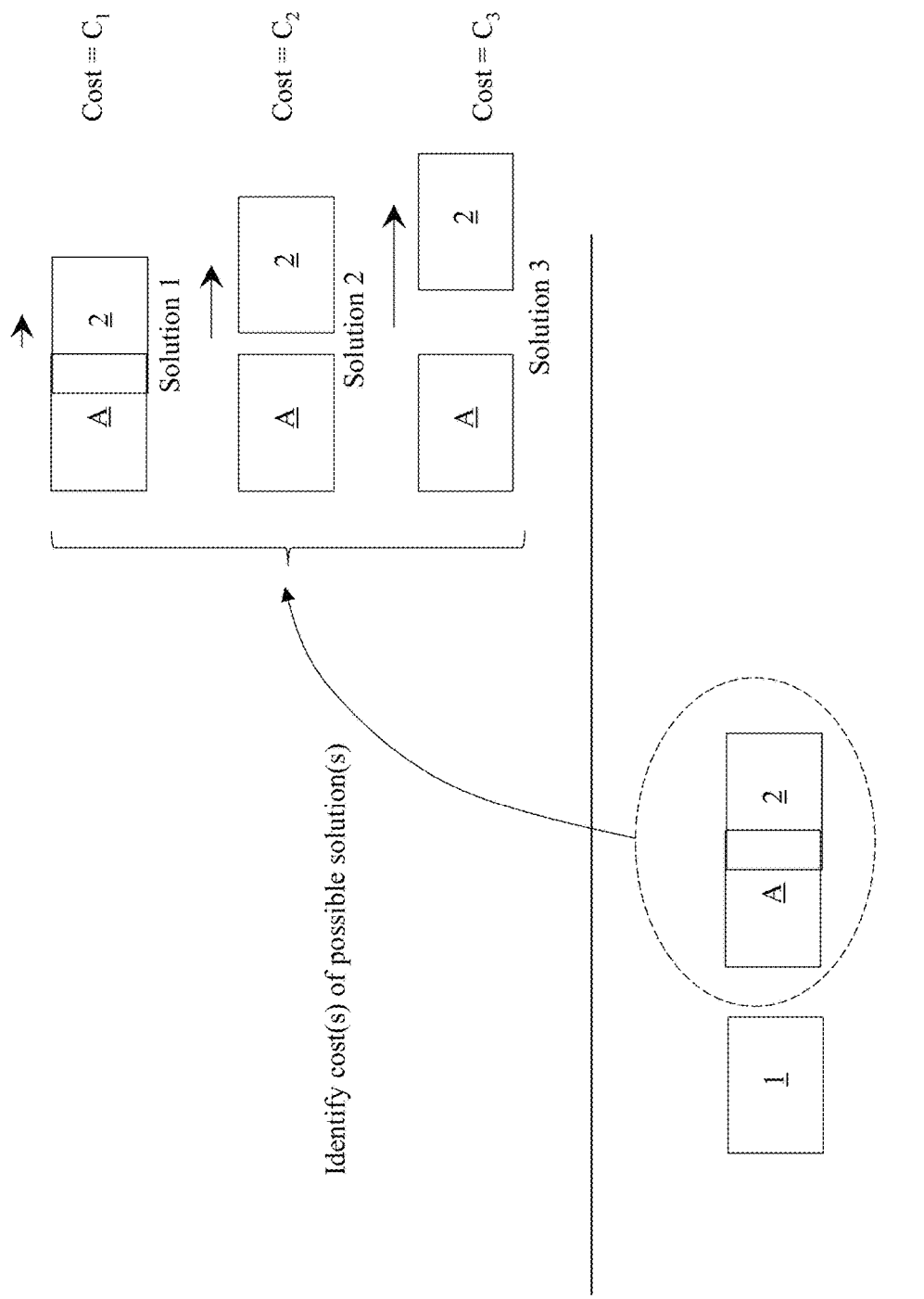
Figure 11I:
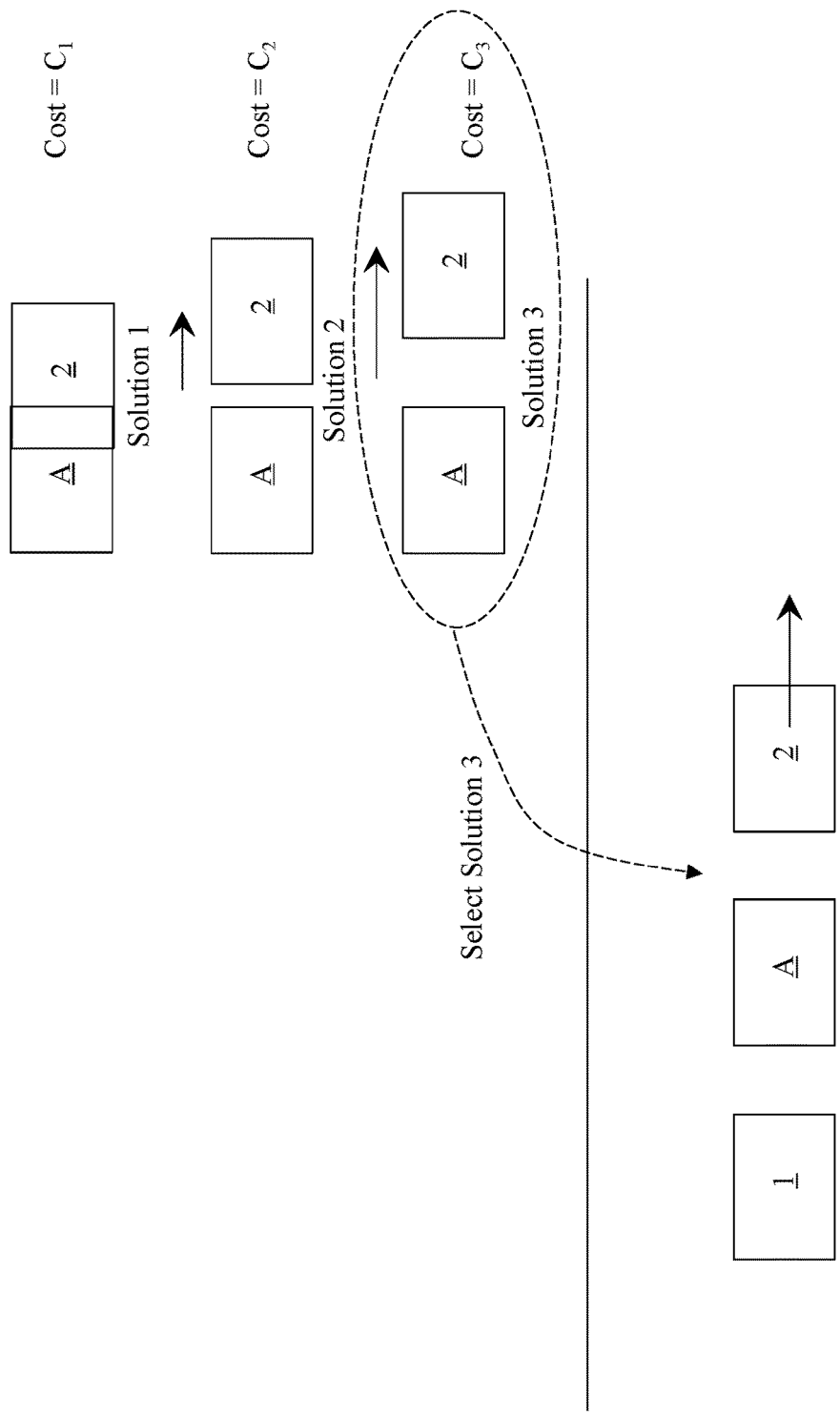

With the first overlap resolved, the processing proceeds to identify any additional overlaps for resolution. As shown in FIG. 11G, the overlap between object A and object 2 is now identified for resolution. As shown in FIG. 11H, various possible movement solutions are identified, with a cost calculated for each possible solution, e.g., Solutions 1, 2, and 3. Here, assume that Solution 3 is the lowest cost solution. Therefore, as shown in FIG. 11I, this solution is applied to move object 2 to resolve the overlap between objects A and 2.

At this point, there are no further overlaps that need to be resolved. Therefore, the process ends and the object movements can be visually displayed to the user in the user interface for consideration and/or possible commitment in the design database.

For the sake of explanation, it is noted that this illustrative example did not include any object movements across rows. However, it is noted that if any of the possible solutions did include a movement between rows, then the wirelength cost factor would be considered to help identify the lowest cost solution to resolve a given overlap.

Figure 12:
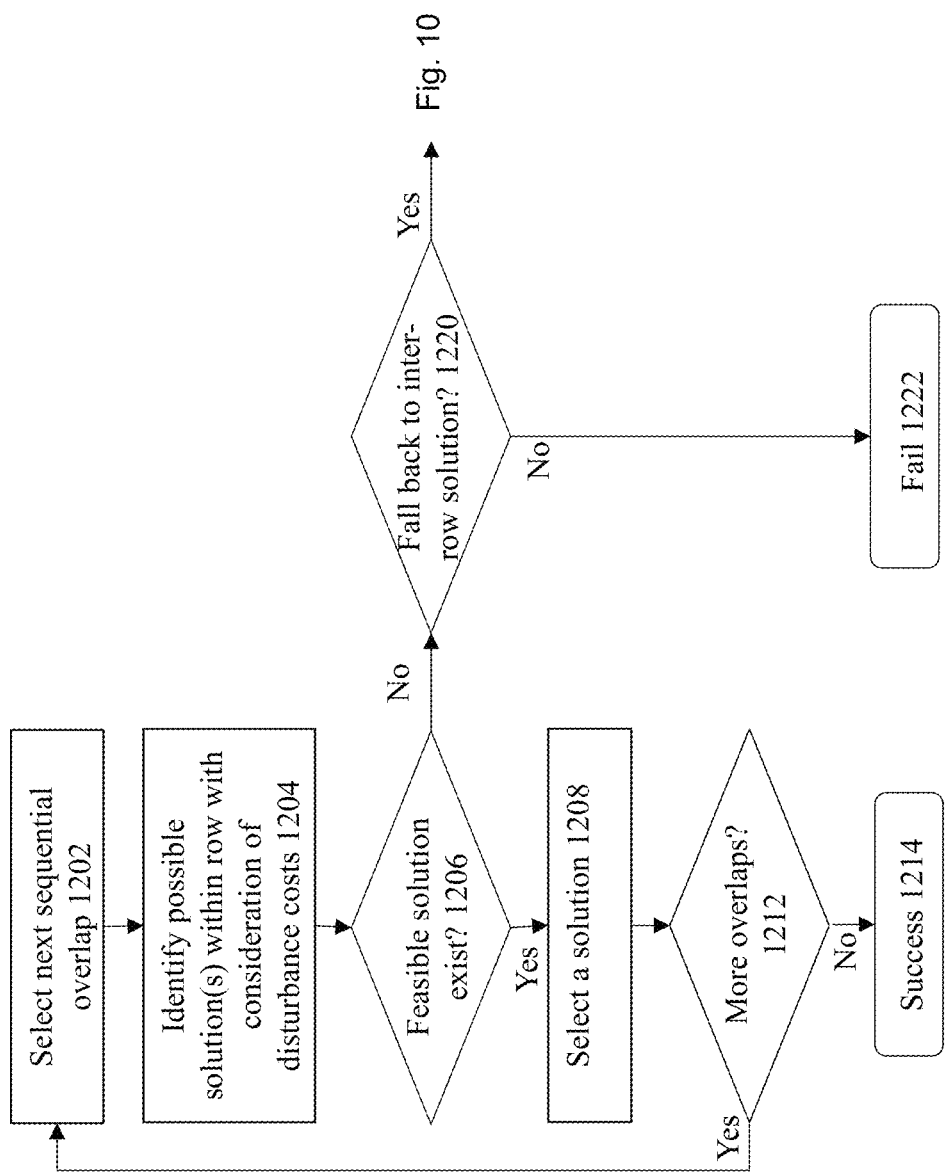
FIG. 12 shows another embodiment of an approach to move existing object, where sequential placements are performed to resolve overlaps.

FIG. 12 shows another embodiment of an approach to move existing object, where sequential placements are performed to resolve overlaps. This approach can be used for interactive placements, where wirelength costs are not considered for the different possible solutions. In addition, this approach may be used to preserve relative locations of instances within a row. However, as a fallback, this flow may exit to use the approach of FIG. 10 on an as-needed basis.

At 1202, the process selects a next sequential overlap to process. Within a row of objects, there may exist one or more overlaps between objects due to a dragged object being moved within a set of pre-existing objects. This step identifies, on a sequential basis, an overlap among the set of overlaps, e.g., in a left-to-right order within a row.

Next, at 1204, possible solutions are identified for the overlap within the row. In particular, different movement options are explored for the selected overlap within the row. In some embodiments, since the object(s) are only moved within the row, this means that the wirelength cost factor is not considered as part of the overall costs for each possible option. However, others of the costs factors described above may be considered for the current costs calculations. For example, the object disturbance costs re perturbation/displacement is considered as one of the costs factors to identify the overall cost of a solution.

A determination is made at 1206 whether a feasible solution exists. If so, then the lowest cost solution is selected at 1208. A determination is made at 1212 whether there are any additional overlaps to process. If so, then the process returns to step 1202 to select the next sequential overlap to process. The process continues until all overlaps have been sequentially processed to resolve the overlaps, where the success state 1214 is reached upon resolution of the final overlap.

If the determination was made at step 1206 that a feasible solution does not exist with the sequential approach, then a further determination is made at 1220 whether to fall back to the approach of moving objects between rows. If so, then the process of FIG. 10 can be applied to move objects between rows. Otherwise, a fail state 1222 is reached.

Figure 13:
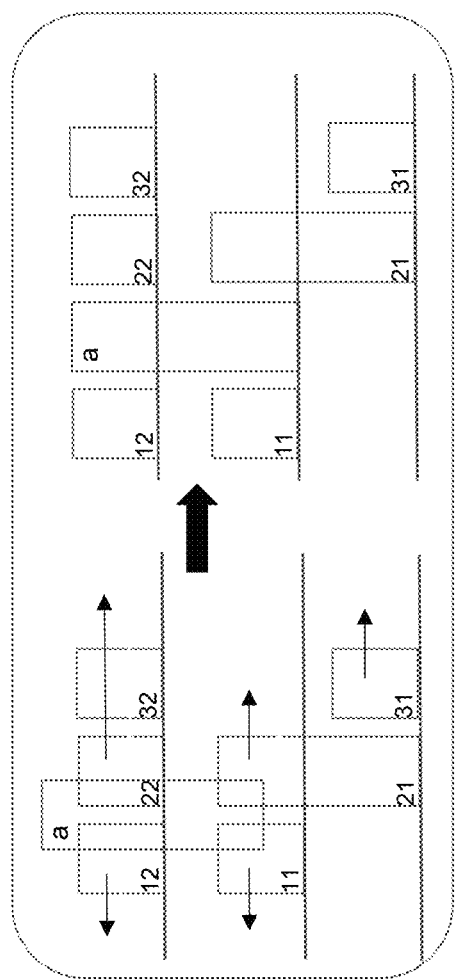
FIG. 13 illustrates movement of objects for mixed-row and multi-row height devices.

It is noted that some or all of the above-described embodiments can be applied for mixed-row and multi-row height devices. For example, consider the illustrative example shown in FIG. 13. Here, object "a" is a device having a device height that transcends multiple rows. When object "a" is dragged as shown on the left-hand side of the figure, overlaps occur for objects "12" and "22" on the top row, as well as overlaps with object "11" on the middle row and object "21" that resides on both the middle and bottom rows. As shown on the right-hand side of the figure, the pre-existing objects are shifted to account for the dragged position of object "a". In particular, objects "12" and "11" on the top row and middle row, respectively, have shifted to the left. In addition, objects "22" and "32" on the top row, object "31" on the bottom row, and object "21" on both the middle and bottom rows have all shifted to the right.

Figure 14:
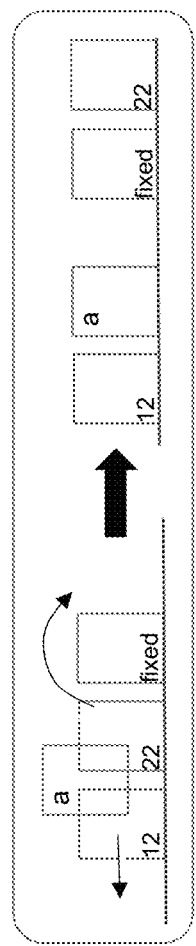
FIG. 14 illustrates the situation where placement constraints are honored during re-placement/movement of shifted objects.

FIG. 14 illustrates the situation where placement constraints (such as a "Fixed" constraint to fix an object at a designated location) are honored during re-placement/movement of shifted objects. Here, the object marked as "fixed" is configured with a constraint to indicate that it is to be fixed to its specified location. Therefore, when object "a" is dragged as shown on the left-hand side of the figure, the resultant movement of objects will endeavor to maintain that specific location of the fixed object. As shown on the right-hand side of the figure, instead of selecting an option that requires movement of the fixed object to resolve the overlaps, object "22" is instead moved in a manner to correct the overlap without movement of the fixed object (e.g., by jumping object "22" around the fixed object).

Figure 15A:
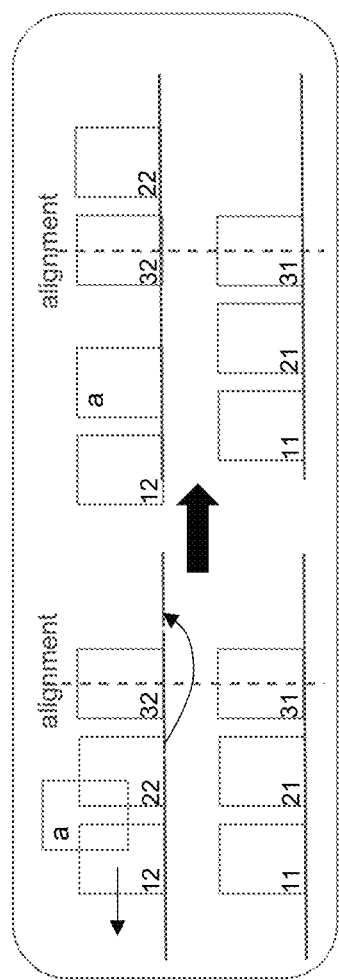
FIGS. 15A-15B illustrate another situation where constraints such as an alignment constraint are honored during re-placement/movement of shifted objects.

FIG. 15A illustrates another situation where constraints (such as an alignment constraint) are honored during re-placement/movement of shifted objects. Here, objects 32 and 31 correspond to an alignment constraint. Therefore, when object "a" is dragged as shown on the left-hand side of the figure, the resultant movement of objects will endeavor to maintain that alignment between objects 32 and 31. As shown on the right-hand side of the figure, instead of selecting an option that requires misalignment of these two objects to resolve the overlaps, object "22" is instead moved in a manner to correct the overlap without movement of the aligned objects (e.g., by jumping object "22" around object 32 on the top row).

Figure 15B:
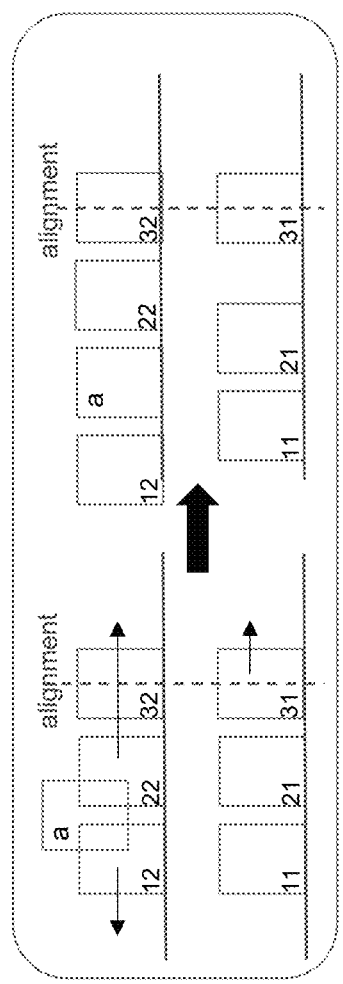

FIG. 15B shows an alternate approach to honor the same alignment constraints addressed by FIG. 15A. Here, when object "a" is dragged as shown on the left-hand side of the figure, the resultant movement of objects will also endeavor to maintain that alignment between objects 32 and 31. However, instead of just moving object "22" in the rightward direction as shown in FIG. 15A, the approach of FIG. 15B to will move objects "22", "32", and "31" all in the rightward direction (as well as object "12" in the leftward direction), which not only creates enough space to fit object "a" into the desired location but also preserves the alignment between objects "32" and "31". The added benefit of this approach is that the relative ordering of the objects is preserved after the multiple object movements.

The various embodiments can also address the situation where devices and standard cells exist in mixed rows of the design. Consider a row having both PMOS and NMOS devices. When an object is selected to be moved in that row, the PMOS and NMOS devices can be moved to a selected location to provide for legal placement for the moving object, e.g., using the above-described processes.

The various embodiments can also address a multi-row Fig Group/Modgen, where there are devices and standard cells on mixed rows. In particular, multiple MOS devices are moved in a specified direction (e.g., left or right) to provide legal placement for moving Fig Group(s) and/or Modgen(s).

A design may include a chain of devices within a device row. In some embodiments, this situation is handled by considering the chain of devices (e.g., having shared source/drain) as a single instance for purposes of object movement to resolve overlaps. The chains themselves can also be placed among other placement objects. In one embodiment, a chain member may also be treated as an individual instance during object movements.

Therefore, what has been described is an improved approach to implement placement for an electronic design, where when dragging an object to a desired area, existing objects in that location are automatically moved as necessary in correspondence to the movement of the dragged object. This is a significant improvement over conventional placement technologies, since the inventive approach provides the ability to create and edit sequences of objects freely and in a predictable manner, while maintaining an overlap-free state. With respect to interactive placement, the user can quickly move the instances in any region of the layout without worry about design rule violations. In addition, refinement can be easily made after auto placement, where if a user does not accept the results of an automatic placement, then the user can perform interactive adjustment to the placement. With regards to routing decongestion, after the placement is performed, the user can use some embodiments to manipulate the cells (e.g., filler cells) to decongest parts of the design. The present embodiments also provide a more efficient approach to perform ECOs (engineering change orders), e.g., to add more details (e.g., fingers) to transistors or buffers in the design.

System Architecture Overview

Figure 16:
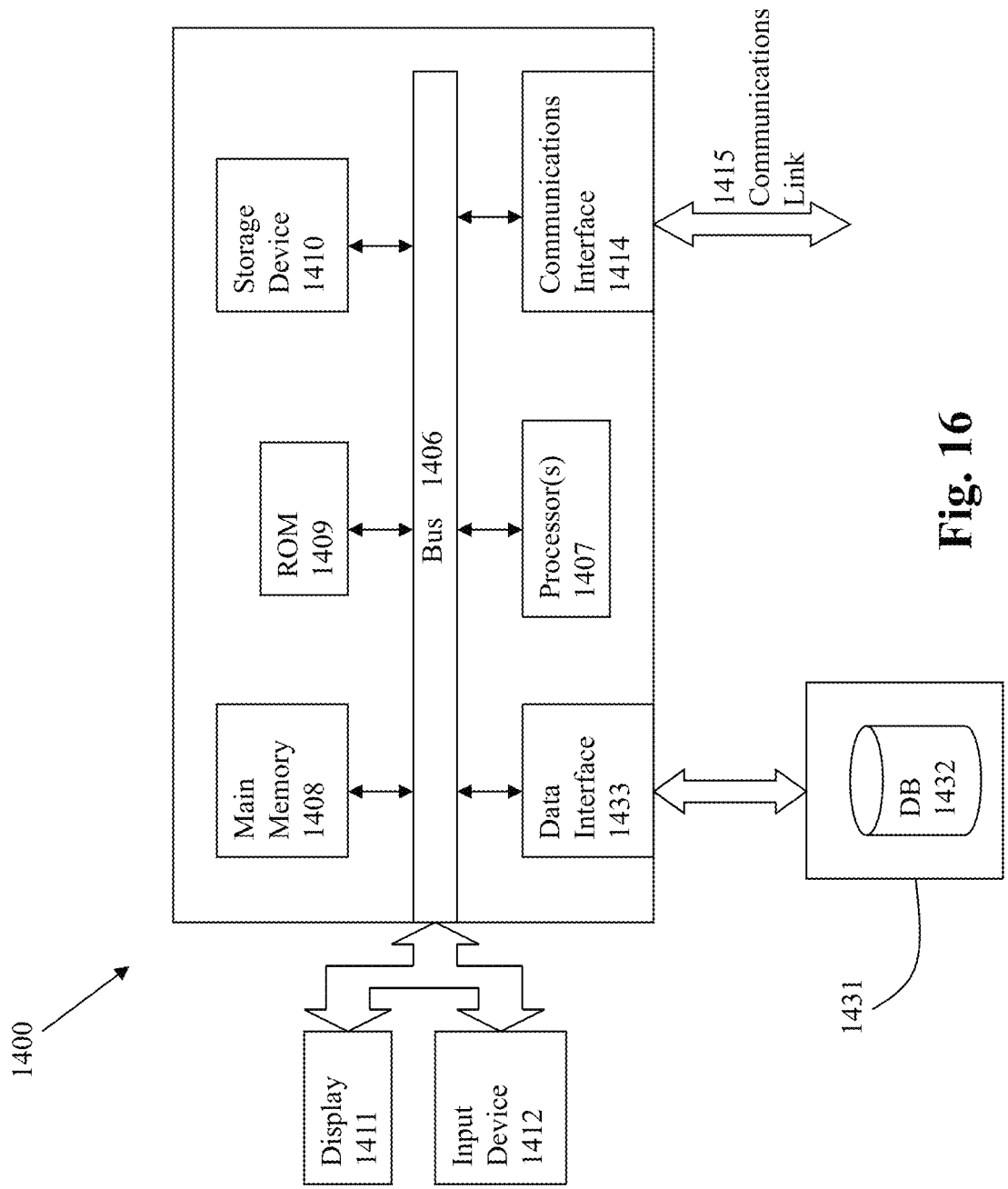
FIG. 16 is a block diagram of an illustrative computing system suitable for implementing an embodiment of the present invention.

FIG. 16 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A method for implementing placement for an electronic design, comprising:

identifying a movement of an object within an electronic design, where the movement of the object causes one or more overlaps with one or more existing objects in the electronic design;

selecting an overlap from the one or more overlaps to correct;

identifying respective costs that respectively correspond to different possible solutions to correct the overlap, wherein a respective cost for a possible solution is determined based at least in part upon information of a perturbation or wirelength that pertains to the possible solution;

selecting a solution having a lower cost to correct the overlap; and visually displaying the object moved to a dragged location, wherein movement of the one or more existing objects is also displayed to locations corresponding to the solution having the lower cost to resolve the overlap.

2. The method of claim 1, wherein the overlap is corrected with a movement mode corresponding to at least one of an any direction mode, preserve dragged location mode, preserve relative location mode, insert single row mode, or insert multiple row mode.

3. The method of claim 1, wherein a cost is calculated by considering a combination of cost factors including at least one or more of a first cost factor for overlaps, a second cost factor for perturbation, a third cost factor for wirelength, a fourth cost factor for placement constraints, or a fifth cost factor for design rule correctness.

4. The method of claim 1, wherein a cost is calculated for the solution that does not involve movement of an object between rows, and where the cost does not include a cost factor for wirelength.

5. The method of claim 4, wherein a chain of devices is considered as a single object for object movement calculations.

6. The method of claim 1, wherein the electronic design corresponds to a row-based design, and wherein the object being moved and the one or more existing objects are located within one or more rows within the row-based design.

7. The method of claim 6, wherein the one or more existing objects are moved within a row to correct the overlap.

8. A computer program product embodied on a non-transitory computer readable medium having stored thereon a sequence of instructions which, when executed by a processor, causes the processor to execute a set of acts, the set of acts comprising:

identifying a movement of an object within an electronic design, where the movement of the object causes one or more overlaps with one or more existing objects in the electronic design;

selecting an overlap from the one or more overlaps to correct;

identifying respective costs that respectively correspond to different possible solutions to correct the overlap, wherein a respective cost for a possible solution is determined based at least in part upon information of a perturbation or wirelength that pertains to the possible solution;

selecting a solution having a lower cost to correct the overlap; and visually displaying the object moved to a dragged location, wherein movement of the one or more existing objects is also displayed to locations corresponding to the solution having the lower cost to resolve the overlap.

9. The computer program product of claim 8, wherein the overlap is corrected with a movement mode corresponding to at least one of an any direction mode, preserve dragged location mode, preserve relative location mode, insert single row mode, or insert multiple row mode.

10. The computer program product of claim 8, wherein a cost is calculated by considering a combination of cost factors including at least one or more of a first cost factor for overlaps, a second cost factor for perturbation, a third cost factor for wirelength, a fourth cost factor for placement constraints, or a fifth cost factor for design rule correctness.

11. The computer program product of claim 8, wherein a cost is calculated for the solution that does not involve movement of an object between rows, and where the cost does not include a cost factor for wirelength.

12. The computer program product of claim 11, wherein a chain of devices is considered as a single object for object movement calculations.

13. The computer program product of claim 8, wherein the electronic design corresponds to a row-based design, and wherein the object being moved and the one or more existing objects are located within one or more rows within the row-based design.

14. The computer program product of claim 13, wherein the one or more existing objects are moved within a row to correct the overlap.

15. A system for implementing a circuit design, comprising:

a processor;

a memory for holding programmable code; and wherein the programmable code includes instructions for identifying a movement of an object within an electronic design, where the movement of the object causes one or more overlaps with one or more existing objects in the electronic design; selecting an overlap from the one or more overlaps to correct; identifying respective costs that respectively correspond to different possible solutions to correct the overlap, wherein a respective cost for a possible solution is determined based at least in part upon information of a perturbation or wirelength that pertains to the possible solution; selecting a solution having a lower cost to correct the overlap; and visually displaying the object moved to a dragged location, wherein movement of the one or more existing objects is also displayed to locations corresponding to the solution having the lower cost to resolve the overlap.

16. The system of claim 15, wherein the overlap is corrected with a movement mode corresponding to at least one of an any direction mode, preserve dragged location mode, preserve relative location mode, insert single row mode, or insert multiple row mode.

17. The system of claim 15, wherein a cost is calculated by considering a combination of cost factors including at least one or more of a first cost factor for overlaps, a second cost factor for perturbation, a third cost factor for wirelength, a fourth cost factor for placement constraints, or a fifth cost factor for design rule correctness.

18. The system of claim 15, wherein a cost is calculated for the solution that does not involve movement of an object between rows, and where the cost does not include a cost factor for wirelength.

19. The system of claim 18, wherein a chain of devices is considered as a single object for object movement calculations.

20. The system of claim 15, wherein the electronic design corresponds to a row-based design, and wherein the object being moved and the one or more existing objects are located within one or more rows within the row-based design.

* * * * *